(12) United States Patent
Yu et al.

(10) Patent No.: US 11,929,321 B2
(45) Date of Patent: Mar. 12, 2024

(54) METHOD FOR FORMING VIA STRUCTURE HAVING LOW INTERFACE RESISTANCE

(71) Applicant: Taiwan Semiconductor Manufacturing Company, Ltd., Hsinchu (TW)

(72) Inventors: Li-Zhen Yu, New Taipei (TW); Lin-Yu Huang, Hsinchu (TW); Cheng-Chi Chuang, New Taipei (TW); Yu-Ming Lin, Hsinchu (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/739,454

(22) Filed: May 9, 2022

(65) Prior Publication Data

US 2022/0262727 A1 Aug. 18, 2022

Related U.S. Application Data

(62) Division of application No. 16/855,690, filed on Apr. 22, 2020, now Pat. No. 11,328,990.

(Continued)

(51) Int. Cl.
*H01L 29/66* (2006.01)
*H01L 21/285* (2006.01)
(Continued)

(52) U.S. Cl.
CPC .... *H01L 23/5226* (2013.01); *H01L 21/28562* (2013.01); *H01L 21/76816* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/76897;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Younes Boulghassoul
(74) *Attorney, Agent, or Firm* — Birch, Stewart, Kolasch & Birch, LLP

(57) ABSTRACT

A method for forming a semiconductor device structure is provided. The method includes forming a first insulating layer over a substrate. A first metal feature is formed in the first insulating layer and a second insulating layer is formed over the first insulating layer. A first metal via is formed through the second insulating layer to connect the first metal feature. A second metal feature is formed over the second insulating layer. The second metal feature has a convex top surface and a plane bottom surface, and the plane bottom is electrically connected to the first metal feature through the first metal via.

20 Claims, 25 Drawing Sheets

Related U.S. Application Data

(60) Provisional application No. 62/906,909, filed on Sep. 27, 2019.

(51) Int. Cl.
| | | |
|---|---|---|
| *H01L 21/768* | (2006.01) | |
| *H01L 21/8234* | (2006.01) | |
| *H01L 23/522* | (2006.01) | |
| *H01L 23/528* | (2006.01) | |
| *H01L 27/088* | (2006.01) | |
| *H01L 29/417* | (2006.01) | |
| *H01L 29/78* | (2006.01) | |

(52) U.S. Cl.
CPC .. *H01L 21/76843* (2013.01); *H01L 21/76852* (2013.01); *H01L 21/76879* (2013.01); *H01L 21/823431* (2013.01); *H01L 21/823475* (2013.01); *H01L 23/5283* (2013.01); *H01L 27/0886* (2013.01); *H01L 29/41791* (2013.01); *H01L 29/66795* (2013.01); *H01L 29/785* (2013.01)

(58) Field of Classification Search
CPC ..... H01L 21/823475; H01L 21/823871; H01L 21/76805; H01L 21/76816; H01L 21/76849; H01L 23/5226; H01L 23/5283; H01L 21/28562; H01L 21/76879; H01L 29/41725–41791; H01L 23/5386; H01L 23/53257; H01L 21/7685; H01L 21/76847; H01L 21/76852; H01L 21/76843; H01L 23/53266

See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2011/0156107 A1* | 6/2011 | Bohr | H01L 23/528 257/E21.409 |
| 2017/0263557 A1* | 9/2017 | Clevenger | H01L 23/53266 |
| 2018/0005901 A1* | 1/2018 | Chi | H01L 27/0924 |
| 2018/0053721 A1 | 2/2018 | Adusumilli et al. | |
| 2019/0148225 A1* | 5/2019 | Chen | H01L 29/785 257/384 |
| 2019/0237402 A1* | 8/2019 | Briggs | H01L 21/76847 |
| 2019/0259855 A1* | 8/2019 | Cheng | H01L 21/28518 |
| 2019/0385909 A1* | 12/2019 | Wu | H01L 21/76883 |
| 2020/0066585 A1* | 2/2020 | Lin | H01L 21/76879 |
| 2020/0098688 A1* | 3/2020 | Shi | H01L 21/28568 |
| 2021/0020500 A1* | 1/2021 | Chung | H01L 21/76841 |
| 2021/0091194 A1* | 3/2021 | Hourani | H01L 29/41775 |
| 2021/0167004 A1* | 6/2021 | Seo | H01L 23/5283 |
| 2021/0257248 A1* | 8/2021 | Chang | H01L 21/76814 |
| 2021/0335720 A1* | 10/2021 | Liang | H01L 23/53238 |
| 2022/0165659 A1* | 5/2022 | Huang | H01L 21/76843 |

* cited by examiner

METHOD FOR FORMING VIA STRUCTURE HAVING LOW INTERFACE RESISTANCE

PRIORITY CLAIM AND CROSS-REFERENCE

This Application is a Divisional Application of U.S. patent application Ser. No. 16/855,690, filed on Apr. 22, 2020, which claims the benefit of U.S. Provisional Application No. 62/906,909, filed on Sep. 27, 2019, and entitled "Interconnect structure with low resistance", the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). Advantages of the FinFET may include reducing the short channel effect and raising the current flow.

Although existing FinFET manufacturing processes have generally been adequate for their intended purposes, as device scaling-down continues, they have not been entirely satisfactory in all respects. For example, in the manufacturing of ICs, via structures are used for connecting to the source/drain contacts and gate contacts which are connected to source/drain regions and the gates of FinFETs. However, it is a challenge to form reliable via structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2A is cross-sectional representation taken along 2-2' line of FIG. 1D.

FIG. 3A is cross-sectional representation taken along 3-3' line of FIG. 1D.

FIG. 5A is cross-sectional representation taken along 5I-5I' line of FIG. 4.

FIG. 5A-1 illustrates a cross-sectional representation of a semiconductor device structure in accordance with some embodiments.

FIG. 5A-2 illustrates a cross-sectional representation of a semiconductor device structure in accordance with some embodiments.

FIG. 5B is cross-sectional representation taken along 5II-5II' line of FIG. 4.

FIG. 6A is cross-sectional representation taken along 6I-6I' line of FIG. 4.

FIG. 6A-1 illustrates a cross-sectional representation of a semiconductor device structure in accordance with some embodiments.

FIG. 6A-2 illustrates a cross-sectional representation of a semiconductor device structure in accordance with some embodiments.

FIG. 6B is cross-sectional representation taken along 6II-6II' line of FIG. 4.

DETAILED DESCRIPTION

Figure 1A:
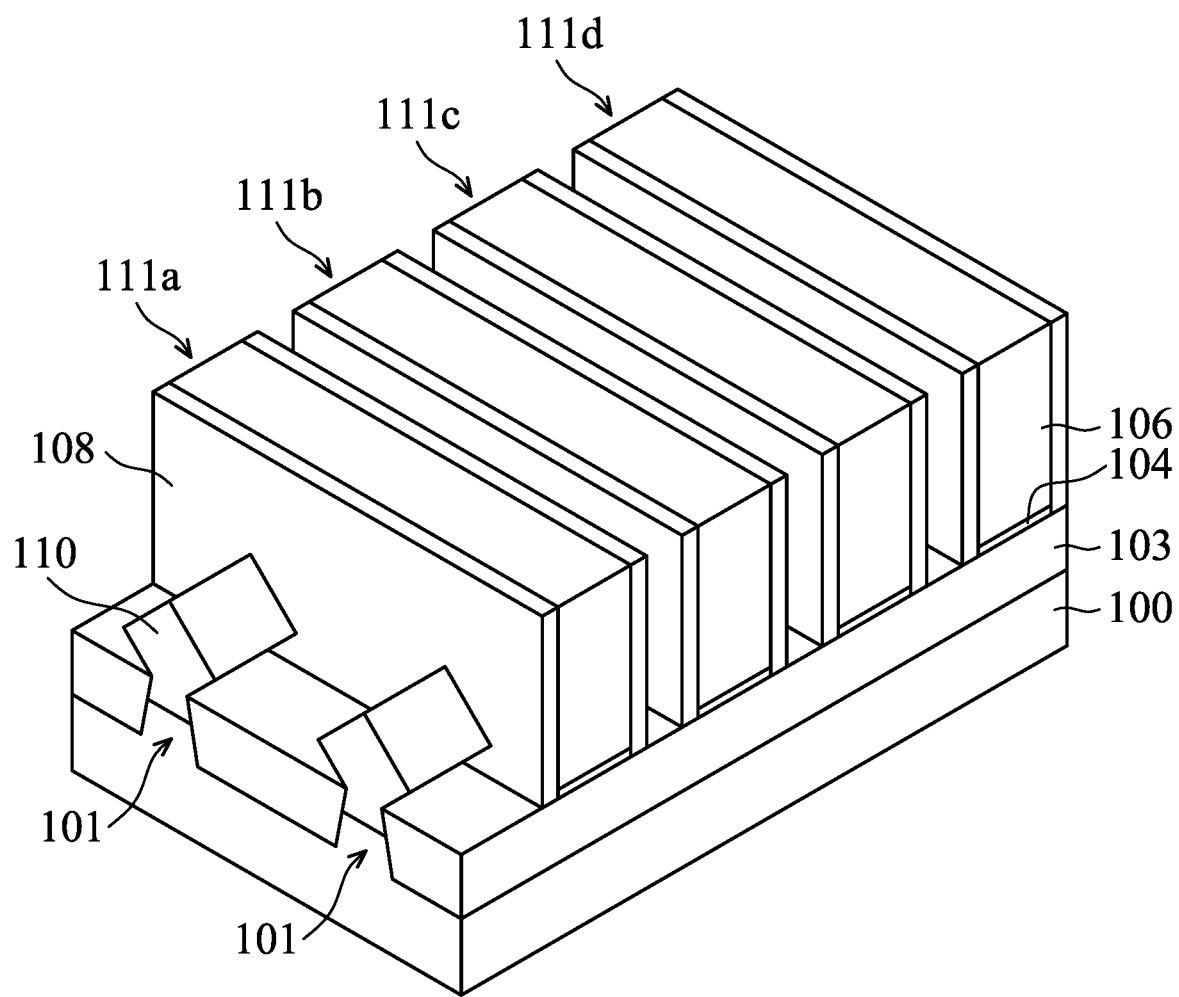
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a metal via formed in a first insulating layer and connected to a gate electrode layer or a source/drain contact. A second insulating layer is formed over first insulating layer and has a trench opening exposing the top of the metal via. Afterwards, a metal hump is selectively formed over the exposed top of the metal via. Afterwards, a conductive liner is formed in the trench opening to cover the metal hump. A metal line is filled in the trench opening and over the conductive liner. Alternatively, the selectively formed metal hump fills the entire trench opening without the formation of the conductive liner and the metal line. In the case of the existence of the conductive liner, although the conductive liner has a higher resistance than that of the metal line and the metal via, the metal hump has a convex top surface and a plane bottom surface each of which has an area greater than the exposed top surface of the metal via. Therefore, the metal via with the metal hump thereon can provide a greater contact area for the metal line than the metal via without the metal hump formed thereon. As a result, the interface resistance between the conductive liner and the metal via can be reduced, thereby mitigating the electric current crowding. In the case of the entire trench opening is filled with the metal hump, such an interface resistance can be eliminated, thereby preventing the electric current crowding. Therefore, the device's performance can be improved.

FIGS. 1A to 1D illustrate perspective views of various stages of manufacturing a semiconductor device structure in accordance with some embodiments. Moreover, FIGS. 2A to 2I illustrate cross-sectional representations of various stages of manufacturing the semiconductor device structure in accordance with some embodiments. FIG. 2A is cross-sectional representation taken along 2-2' line of FIG. 1D. In addition, FIGS. 3A to 3I illustrate cross-sectional representations of various stages of manufacturing the semiconductor device structure in accordance with some embodiments. FIG. 3A is cross-sectional representation taken along 3-3' line of FIG. 1D. In some embodiments, the semiconductor device structure includes one or more transistors (e.g., fin field effect transistors (FinFETs)) and an interconnect structure electrically connected to the FinFETs. As shown in FIG. 1A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 includes a PMOS region for P-type FinFETs formed thereon. The PMOS region of the substrate 100 may include Si, SiGe, SiGeB, or an III-V group semiconductor material (such as InSb, GaSb, or InGaSb). In some embodiments, the substrate 100 includes an NMOS region for N-type FinFETs formed thereon. The NMOS region of the substrate 100 may include Si, SiP, SiC, SiPC, or an III-V group semiconductor material (such as InP, GaAs, AlAs, InAs, InAlAs, or InGaAs). In some other embodiments, the substrate 100 includes the PMOS region and the NMOS region.

Afterwards, a fin structure 101 and an isolation feature 103 are successively formed over the substrate 100, as shown in FIG. 1A in accordance with some embodiments. In some embodiments, the substrate 100 is patterned to form the fin structure 101. The isolation feature 103 is a shallow trench isolation (STI) structure, and the fin structure 101 is surrounded by the isolation feature 103. The isolation feature 103 may be formed by depositing an insulating layer (not shown) over the substrate 100 and recessing the insulating layer. The insulating layer for the formation of the isolation feature 103 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 111a, 111b, 111c, and 111d are formed across the fin structure 101 over the substrate 100 to cover the isolation feature 103, as shown in FIG. 1A in accordance with some embodiments. Each of the dummy gate structures 111a, 111b, 111c, and 111d includes a dummy gate dielectric layer 104 and a dummy gate electrode layer 106 formed over the dummy gate dielectric layer 104. As an example, the dummy gate dielectric layer 104 may be made of silicon oxide, and the dummy gate electrode layer 106 may be made of polysilicon.

Afterwards, insulating spacers (e.g., gate spacers 108) are formed on the opposite sidewalls of each of the dummy gate structures 111a, 111b, 111c, and 111d, in accordance with some embodiments. Each gate spacer 108 may include a single layer or a multiple structure. In some embodiments, the gate spacer 108 includes a single layer, as shown in FIG. 1A. In some embodiments, the gate spacer 108 is made of is made of SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The gate spacer 108 may have a thickness that is in a range from about 5 nm to about 30 nm. The insulating layer may be formed by performing a chemical vapor deposition (CVD) process, a plasma enhanced CVD (PECVD) process, low-pressure CVD (LPCVD) process, an atomic layer deposition (ALD) process, or another applicable process.

After formation of the gate spacers 108, source/drain regions 110 (which are also referred to as source/drain features) are formed in the fin structure 101 laterally adjacent to and exposed from the dummy gate structures 111a, 111b, 111c, and 111d, as shown in FIG. 1A in accordance with some embodiments. In some embodiments, the source/drain regions 110 is formed by recessing the portions of the fin structure 101 laterally adjacent to the dummy gate structures 111a, 111b, 111c, and 111d and growing semiconductor materials in the formed recesses in the fin structure 101 by performing epitaxial (epi) growth processes. For example, the semiconductor device structure may be an NMOS device, and the source/drain regions 110 may include Si, SiP, SiC, SiPC, or an III-V group semiconductor material (such as InP, GaAs, AlAs, InAs, InAlAs, or InGaAs), or the like. Alternatively, the semiconductor device structure may be a PMOS device, and the source/drain regions 110 may include Si, SiGe, SiGeB, or an III-V group semiconductor material (such as InSb, GaSb, or InGaSb), or the like. The source/drain regions 110 protrude above the isolation feature 103, as shown in FIG. 1A.

Figure 1B:
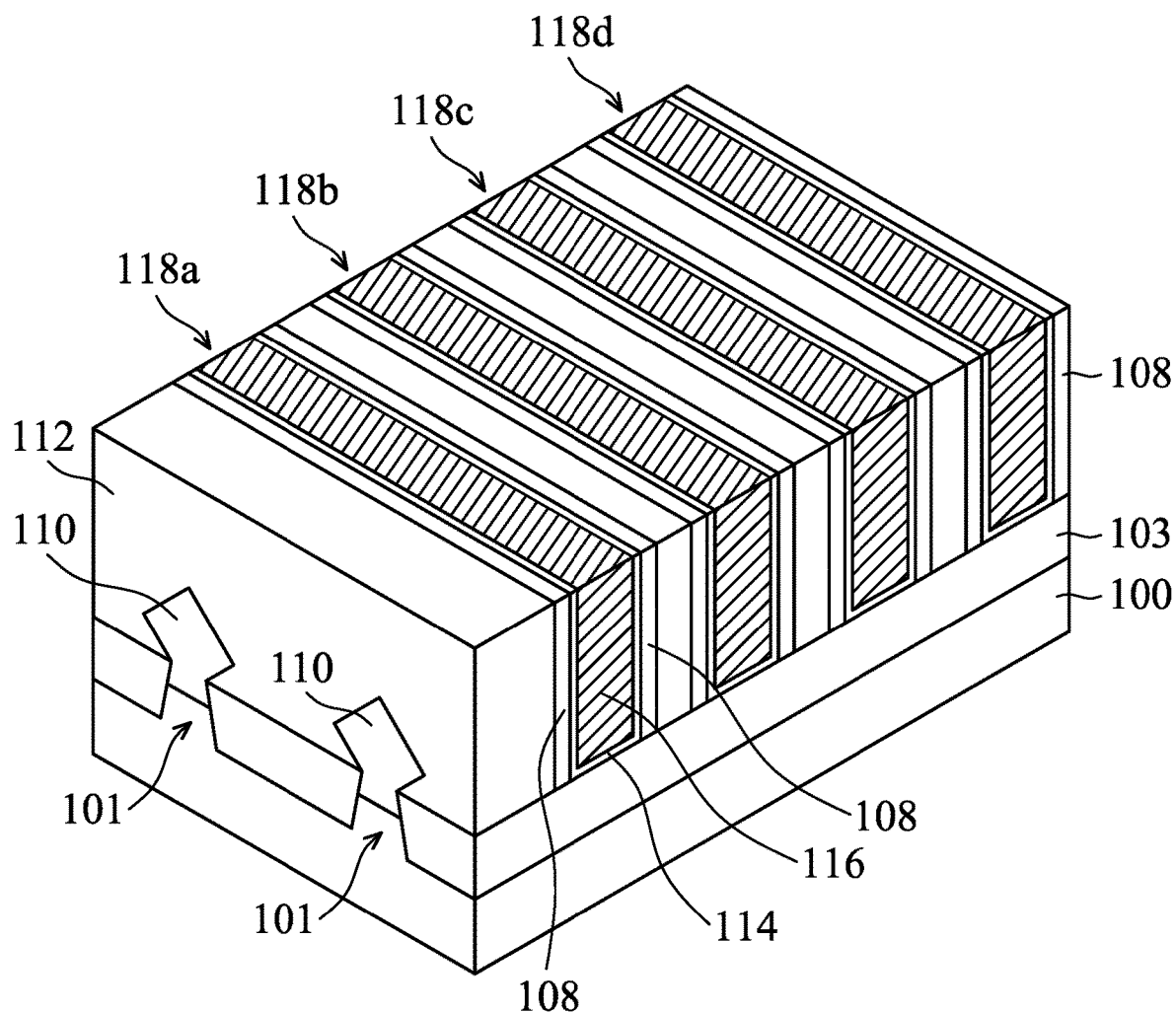
Figure 2A:
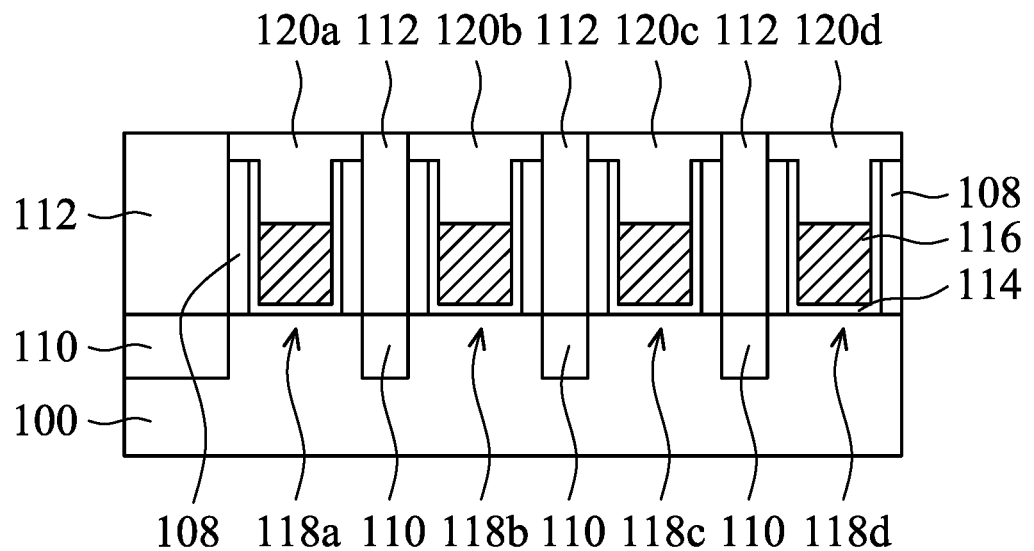
FIGS. 2A to 2I illustrate cross-sectional representations of various stages of manufacturing the semiconductor device structure in accordance with some embodiments.
Figure 2B:
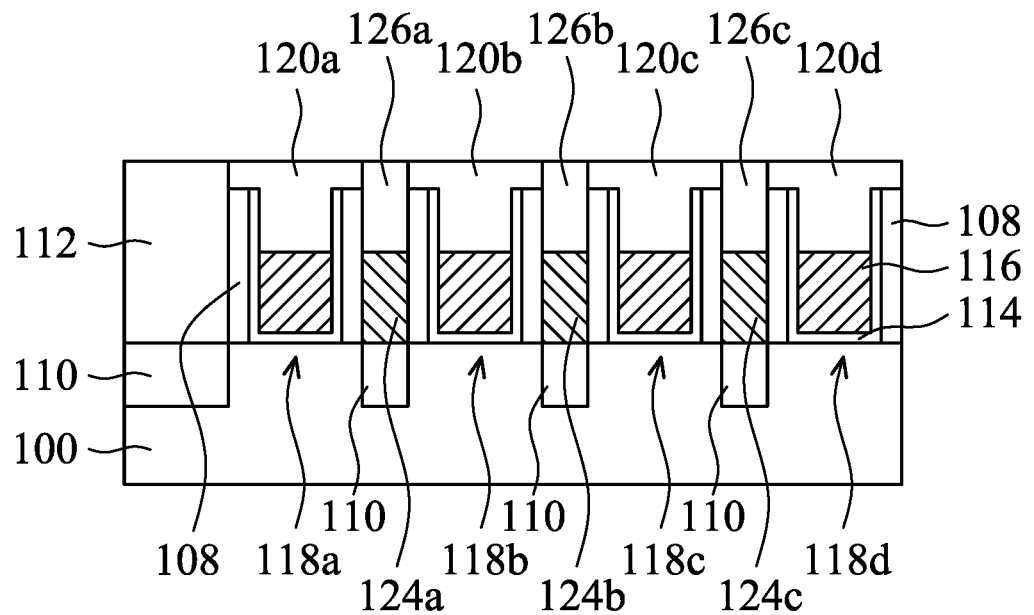

After the source/drain regions 110 are formed, an insulating layer 112 is formed over the fin structure 101 of the substrate 100 and covers the isolation feature 103 and the source/drain regions 110, as shown in FIG. 1B in accordance with some embodiments. The insulating layer 112 may serve as an interlayer dielectric (ILD) layer) and may be a single layer or include multiple dielectric layers with the same or different dielectric materials. For example, the insulating layer 112 may be a single layer made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 112 may be deposited using any suitable method, such as a chemical vapor deposition (CVD) process, a plasma enhanced CVD (PECVD) process, flowable CVD (FCVD) process, the like, or a combination thereof.

Afterwards, the dummy gate structures 111a, 111b, 111c, and 111d are removed and replaced by gate structures 118a, 118b, 118c, and 118d, as shown in FIG. 1B in accordance with some embodiments. In some embodiments, each of the adjacent gate structures 118a, 118b, 118c, and 118d includes a gate dielectric layer 114, a gate electrode layer 116, and the gate spacers 108. The gate dielectric layer 114 may be made of metal oxides, metal nitrides, metal silicates, transition metal-oxides, transition metal-nitrides, transition metal-silicates, oxynitrides of metals, or other applicable dielectric materials.

In some embodiments, the gate electrode layer 116 is made of a conductive material, such as aluminum, copper, tungsten, titanium, tantalum, or another applicable material. Each of the gate structures 118a, 118b, 118c, and 118d may further include a work functional metal layer (not shown) between the gate dielectric layer 114 and the gate electrode layer 116, so that the gate structures 118a, 118b, 118c, and 118d have the proper work function values. The work function metal layer may be made of TiN, TaN, Ru, Mo, Al, WN, $ZrSi_2$, $MoSi_2$, $TaSi_2$, $NiSi_2$, WN, or a combination thereof. Alternatively, the work function metal layer may be made of Ti, Ag, TaAl, TaAlC, TiAlN, TaC, TaCN, TaSiN, Mn, Zr, or a combination thereof.

Figure 1C:
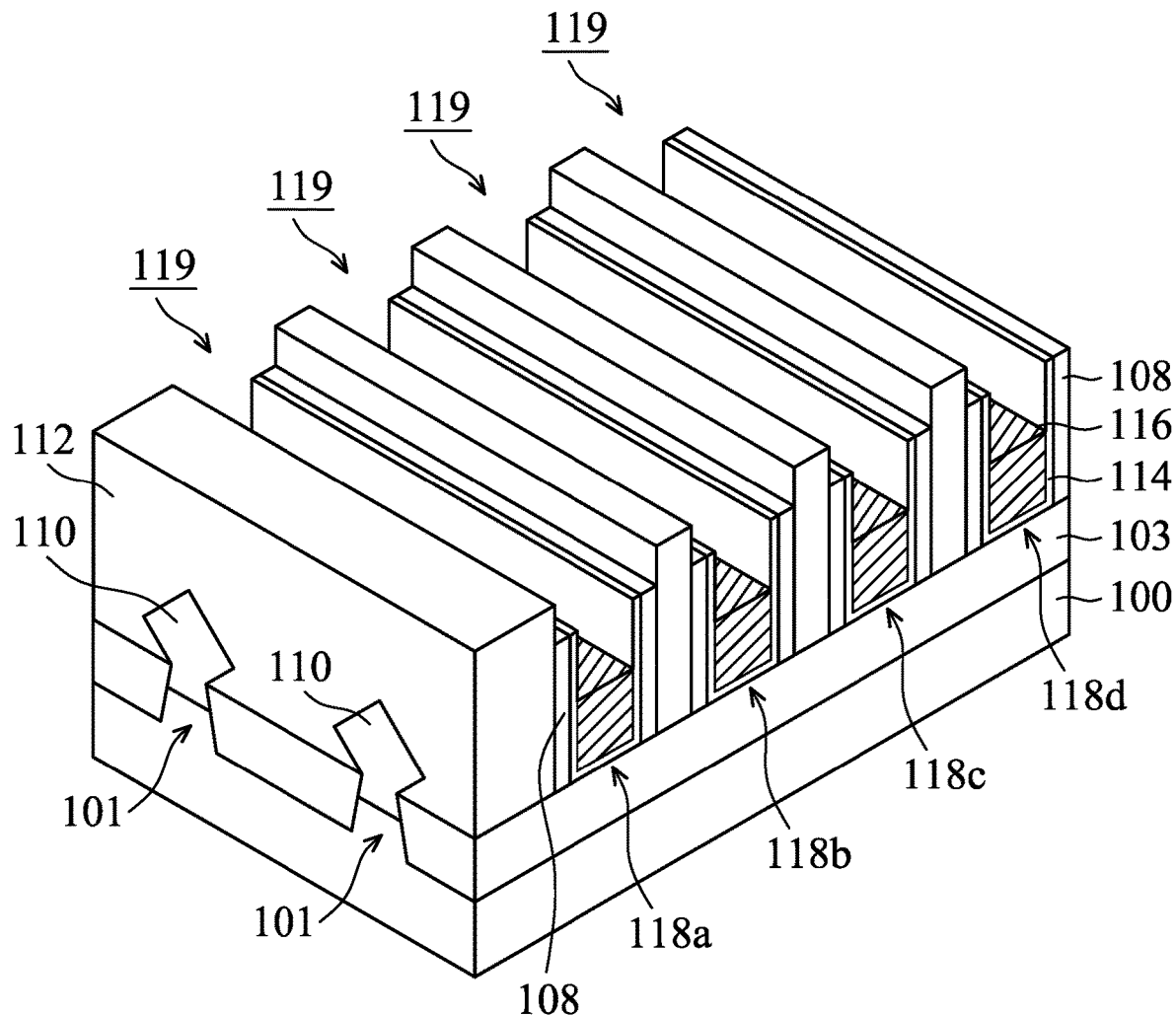

The gate structures 118a, 118b, 118c, and 118d are etched to form recesses 119, as shown in FIG. 1C in accordance with some embodiments. During the etching, top portions of the gate dielectric layers 130 and the gate spacers 108 are also etched, so that upper sidewalls of the insulating layer 112 are exposed by the recesses 119. In some embodiments, each of the gate electrode layers 116 is further etched after the upper sidewalls of the insulating layer 112 are exposed. As a result, the top surface of each gate spacer 108 and the top surface of each gate dielectric layer 114 are higher than the top surface of the corresponding gate electrode layer 116, as shown in FIG. 1C.

Afterwards, a conductive capping feature (not shown) is optionally formed to cover each of the recessed gate electrode layers 116, in accordance with some embodiments. The conductive capping features and the underlying gate electrode layer 116 form gate stacks of the gate structures 118a, 118b, 118c, and 118d. In some embodiments, the top surface of each gate spacer 108 is higher than the top surface of each gate stack. The conductive capping features protect the gate electrode layers 116 from damage or loss during subsequent processing. In some embodiments, the conductive capping features are made of a metal material, such as tungsten or fluorine-free tungsten.

Figure 1D:
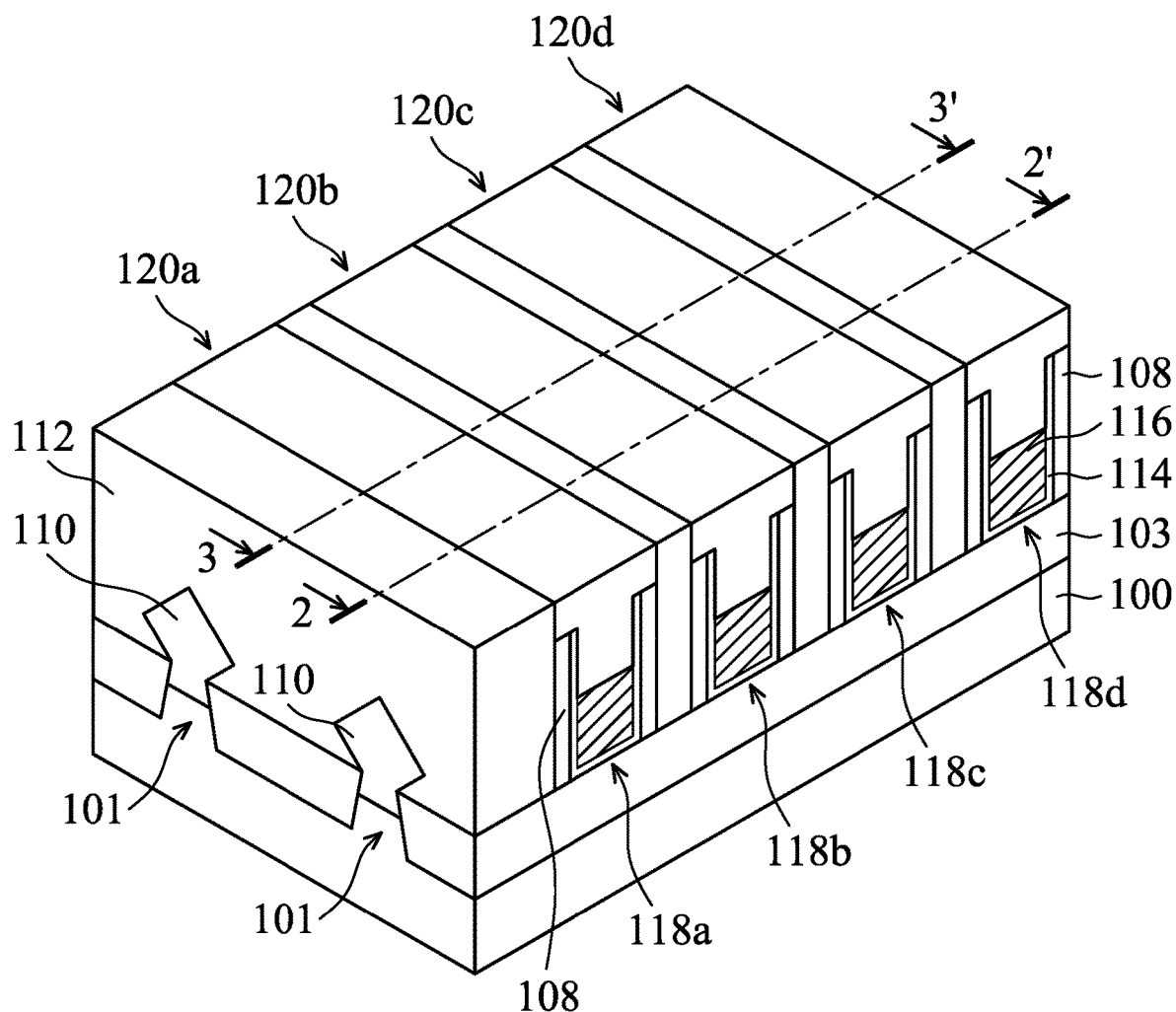

Afterwards, insulating capping layers 120a, 120b, 120c, and 120d are formed in the recesses 119 (not shown and as indicated in FIG. 1C) to respectively cover the top surfaces of the gate structures 118a, 118b, 118c, and 118d, as shown in FIG. 1D in accordance with some embodiments. In some embodiments, an insulating layer (not shown) used for formation of the insulating capping layers 120a, 120b, 120c, and 120d is formed over the structure shown in FIG. 1C and fills the recesses 119. For example, the insulating layer is made of a material that is different from the material of the insulating layer 112. For example, insulating layer is made of SiO, HfSi, SiOC, AlO, ZrSi, AlON, ZrO, HfO, TiO, ZrAlO, ZnO, TaO, LaO, YO, TaCN, SiN, SiOCN, Si, ZrN, or SiCN. The insulating layer may have a thickness that is less than or substantially equal to about 50 nm. The insulating layer may be formed by performing a chemical vapor deposition (CVD) process, a plasma enhanced CVD (PECVD) process, low-pressure CVD (LPCVD) process, an atomic layer deposition (ALD) process, or another applicable process. In some embodiments, a polishing process, such as a chemical mechanical polishing (CMP) process, is performed to remove the excess insulating layer above the insulating layer 112. The polishing process is performed on the insulating layer until the insulating layer 112 is exposed and planarized. As a result, the remaining insulating layers in the recesses 119 form insulating capping layers 120a, 120b, 120c, and 120d. The top surfaces of the insulating capping layers 120a, 120b, 120c, and 120d are substantially level with the top surface of the insulating layer 112, as shown in FIGS. 1D, 2A and 3A. The insulating capping layers 120a, 120b, 120c, and 120d serve as etch stop layers and protect the gate structures 118a, 118b, 118c, and 118d in the subsequent manufacturing processes (e.g., etching processes).

After the formation of the insulating capping layers 120a, 120b, 120c, and 120d, a masking layer (not shown) is formed over the insulating layer 112 and covers the insulating capping layers 120a, 120b, 120c, and 120d, in accordance with some embodiments. In some embodiments, the masking layer includes a tri-layer resist structure including a bottom layer, a middle layer, and a top layer. More specifically, the bottom layer may contain a material that is patternable and/or have anti-reflection properties, such as a bottom anti-reflective coating (BARC) layer. The middle layer (which is also referred to as a hard mask layer) provides hard mask properties for the photolithography process. The middle layer may be made of silicon nitride, silicon oxynitride or silicon oxide. The top layer may be a positive photoresist or negative photoresist. In some other embodiments, the tri-layer resist structure includes oxide-nitride-oxide (ONO) layers.

Afterwards, self-aligned openings are formed through the masking layer and the insulating layer 112 to expose the top surfaces of some source/drain regions 110 between the gate structures 118a and 118b, between the gate structures 118b and 118c, and between the gate structures 118c and 118d, in accordance with some embodiments. In some embodiments, the self-aligned openings are formed by patterning the masking layer and the insulating layer 112. During the patterning of the insulating layer 112, the insulating capping layers 120a, 120b, 120c, and 120d are used as etch masks, so as to define source/drain contact regions 110 between the gate structures 120a, 120b, 120c, and 120d.

Afterward, a conductive material (not shown) is formed over the patterned masking layer and fills the self-aligned openings, in accordance with some embodiments. In some embodiments, the conductive material is made of Co, W, Ru, Ni, Rh, Al, Mo, Cu, or a metal compound, or the like. The conductive material may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Figure 3A:
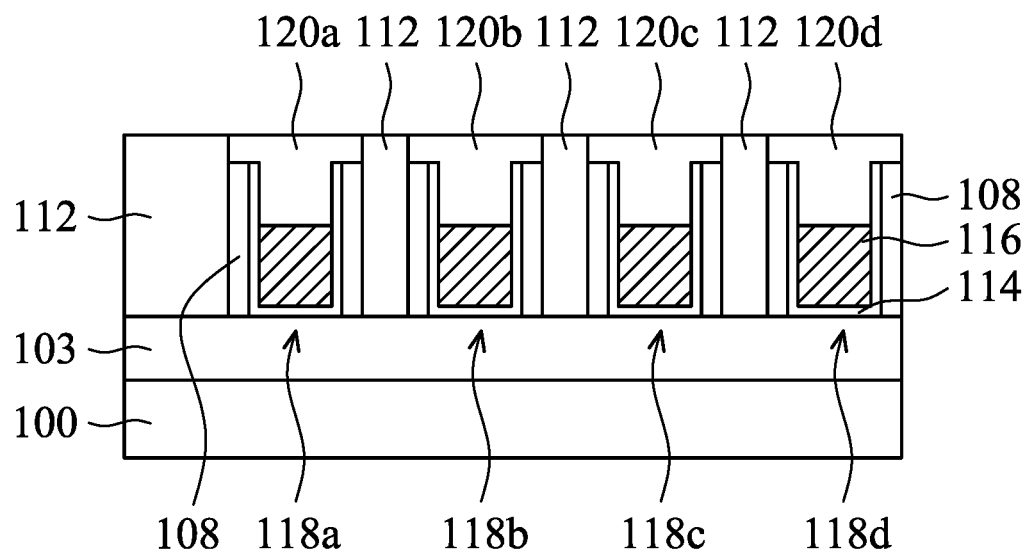
FIGS. 3A to 3I illustrate cross-sectional representations of various stages of manufacturing the semiconductor device structure in accordance with some embodiments.
Figure 3B:
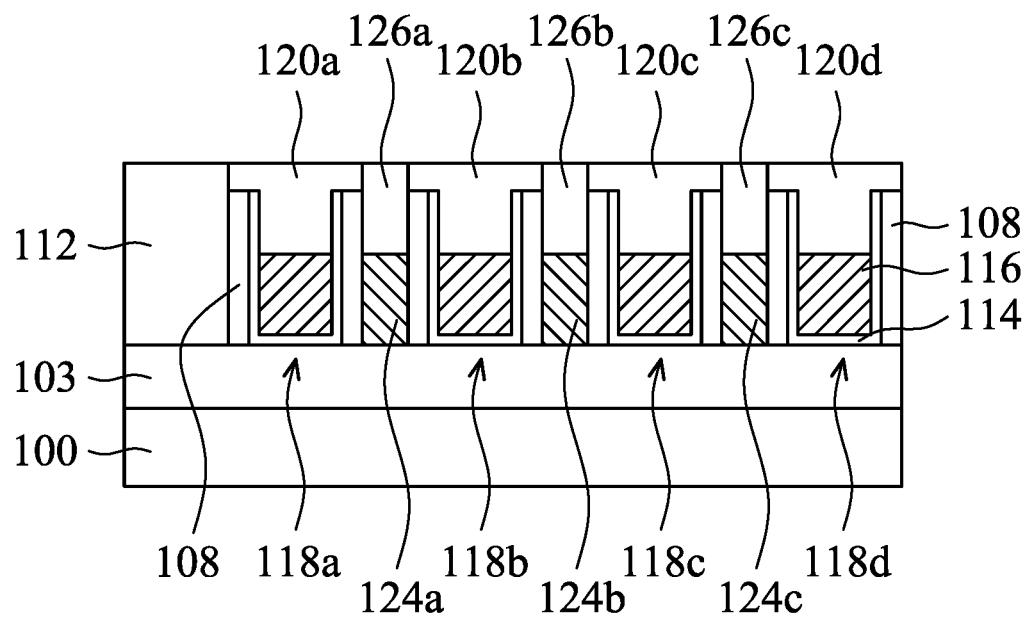

A polishing process, such as chemical mechanical polishing (CMP) process, is performed on the conductive material 155 until the insulating capping layers 120a, 120b, 120c, and 120d are exposed and planarized, in accordance with some embodiments. As a result, the remaining conductive material forms a source/drain contact 124a between and laterally adjacent to the gate structures 118a and 118b, a source/drain contact 124b between and laterally adjacent to the gate structures 118b and 118c, and a source/drain contact 124c between and laterally adjacent to the gate structures 118c and 118d, as shown in FIGS. 2B and 3B. Those source/drain contacts 124a, 124b, and 124c are electrically connected to the corresponding source/drain regions 110 and therefore they are also referred to as self-aligned source/drain contacts or self-aligned source/drain electrodes. Afterwards, the masking layer is removed.

Afterwards, the source/drain contacts 124a, 124b, and 124c are etched to form recesses (not shown), in accordance with some embodiments. As a result, the top surfaces of the source/drain contacts 124a, 124b, and 124c are lower than the top surfaces of the insulating capping layers 120a, 120b, 120c, and 120d and the top surfaces of the insulating spacers (i.e., gate spacers 108).

After the source/drain contacts 124a, 124b, and 124c are recessed, insulating capping layers 126a, 126b, 126c, and 126d are formed in the recesses to cover the source/drain contacts 124a, 124b, and 124c, respectively, as shown in FIGS. 2B and 3B in accordance with some embodiments. In some embodiments, each of the insulating capping layers 126a, 126b, 126c, and 126d has a top surface that is substantially level to the top surfaces of the insulating capping layers 120a, 120b, 120c, and 120d. In some embodiments, each of the insulating capping layers 126a, 126b, 126c, and 126d has a thickness that is less than or substantially equal to 50 nm. Moreover, the insulating capping layers 126a, 126b, 126c, and 126d are made of a material that is different from the material of the insulating capping layers 120a, 120b, 120c, and 120d and the material of the gate spacers 108. For example, the insulating capping layers 126a, 126b, 126c, and 126d are made of SiO, HfSi, SiOC, AlO, ZrSi, AlON, ZrO, HfO, TiO, ZrAlO, ZnO, TaO, LaO, YO, TaCN, SiN, SiOCN, Si, ZrN, or SiCN. The insulating capping layers 126a, 126b, 126c, and 126d may be formed by performing a deposition process (e.g., chemical vapor deposition (CVD) process, a plasma enhanced CVD (PECVD) process, low-pressure CVD (LPCVD) process, an atomic layer deposition (ALD) process, or another applicable process) followed by a polishing process (e.g., a chemical mechanical polishing (CMP) process).

Figure 2C:
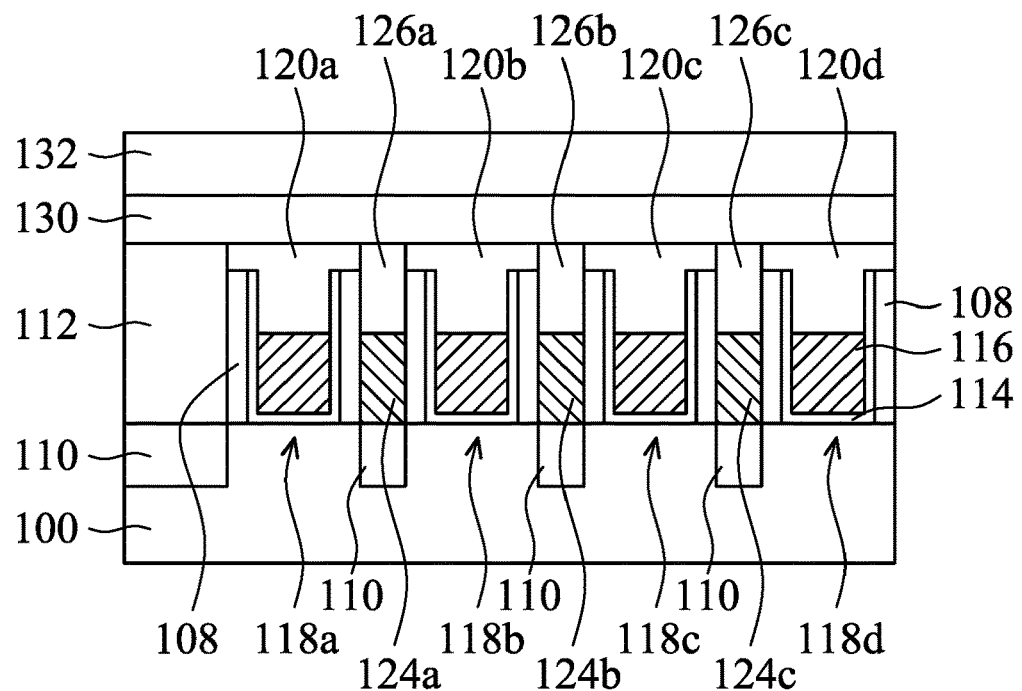
Figure 3C:
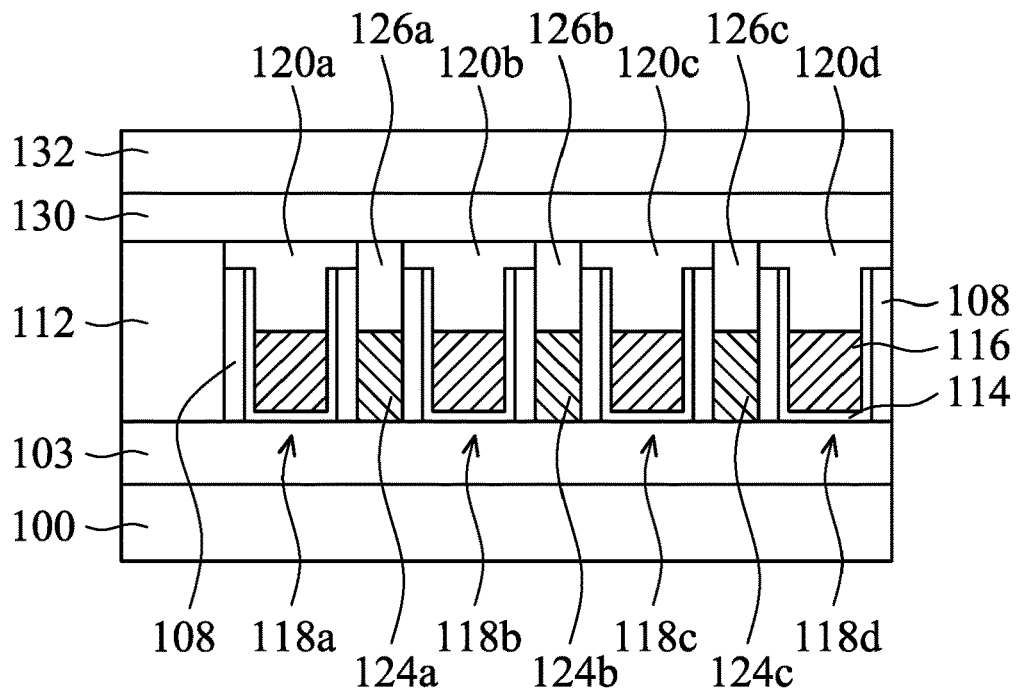

After the formation of the insulating capping layers 126a, 126b, 126c, and 126d, insulating layers 130 and 132 are successively formed over the insulating layer 112 and cover the insulating capping layers 126a, 126b, 126c, and 126d, as shown in FIGS. 2C and 3C in accordance with some embodiments. In some embodiments, the insulating layer 130 serves as an etch stop layer and is made of SiN, SiCN, SiOC, SiON, SiCN, or SiOCN. The insulating layer 130 may be formed by performing a chemical vapor deposition (CVD) process, a plasma enhanced CVD (PECVD) process, low pressure CVD (LPCVD) process, an atomic layer deposition (ALD) process, or another applicable processes.

In some embodiments, the insulating layer 132 includes a single layer or multilayers and is made of $SiO_2$, SiOC, $ZrO_2$, $HfO_2$, or another applicable dielectric material, or a combination thereof. The insulating layer 132 serves as an interlayer dielectric (ILD) layer and is made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 132 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

Figure 2D:
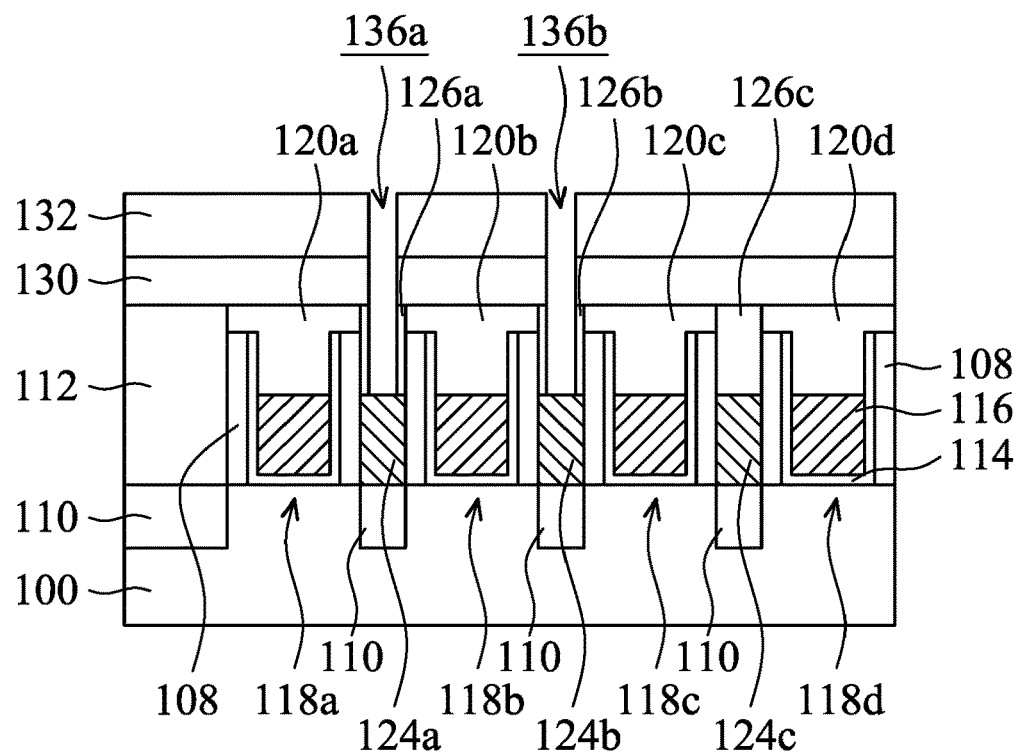

After the insulating layer 132 is formed, one or more via openings are formed and pass through the insulating layer 132, the insulating layer 130, the insulating capping layers 120a and 120b, and the insulating capping layers 126a and 126b. In some embodiments, via openings 136a and 136b that pass through and are surrounded by the insulating layer 132, the insulating layer 130, the insulating capping layers 120a and 120b, and the insulating capping layers 126a and 126b are formed, so as to expose the top surfaces of the source/drain contacts 124a and 124b, as shown in FIG. 2D. Similarly, via openings 138a and 138b that pass through and are surrounded by the insulating layer 132, the insulating layer 130, the insulating capping layers 120a and 120b, and the insulating capping layers 126a and 126b are formed, so as to expose the top surfaces of the gate electrode layers 116 of the gate structures 118b and 118c, as shown in FIG. 3D in accordance with some embodiments.

In some embodiments, those via openings 136a, 136b, 138a, and 138b are formed by performing photolithography and etching processes. For example, an etching process (such as a dry etching process) may be performed using the insulating layer 130 as an etch stop layer after the photolithography process, so that openings through the insulating layer 132 are formed and the insulating layer 130 is exposed. Afterwards, one or more etching processes (such as dry etching processes) may be performed to etch the insulating layer 130 and the insulating capping layers 120a, 120b, 126a, and 126b. In some other embodiments, the via openings 136a and 136b and the via openings 138a, and 138b are formed by respective photolithography processes and etching processes. In other words, the via openings 136a and 136b may be formed before or after the formation of the via openings 138a, and 138b.

Figure 2E:
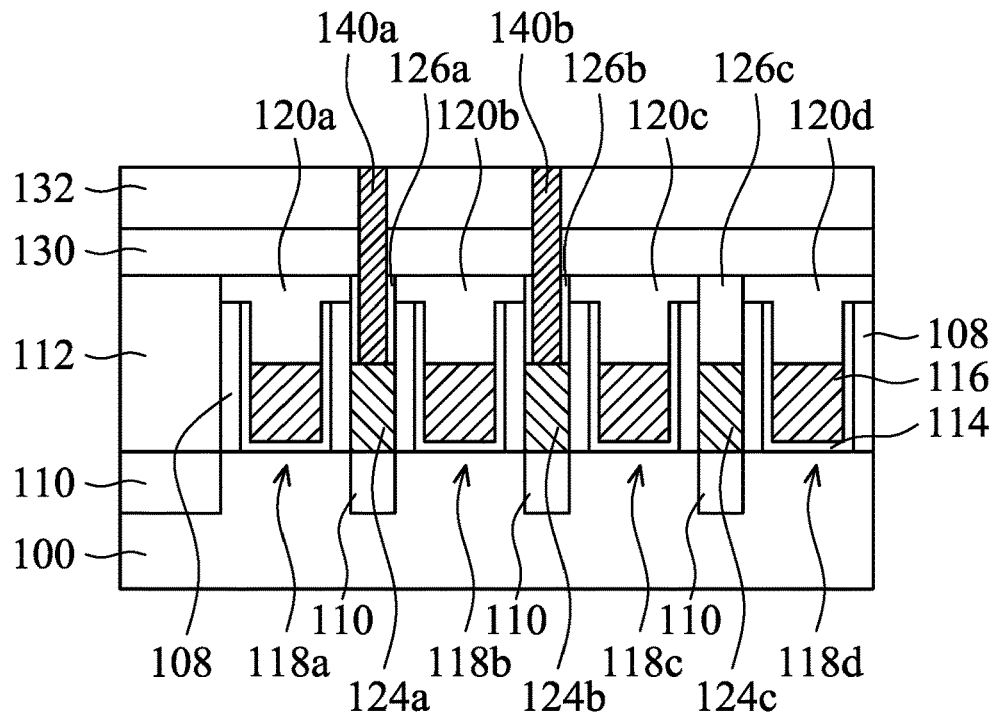
Figure 3D:
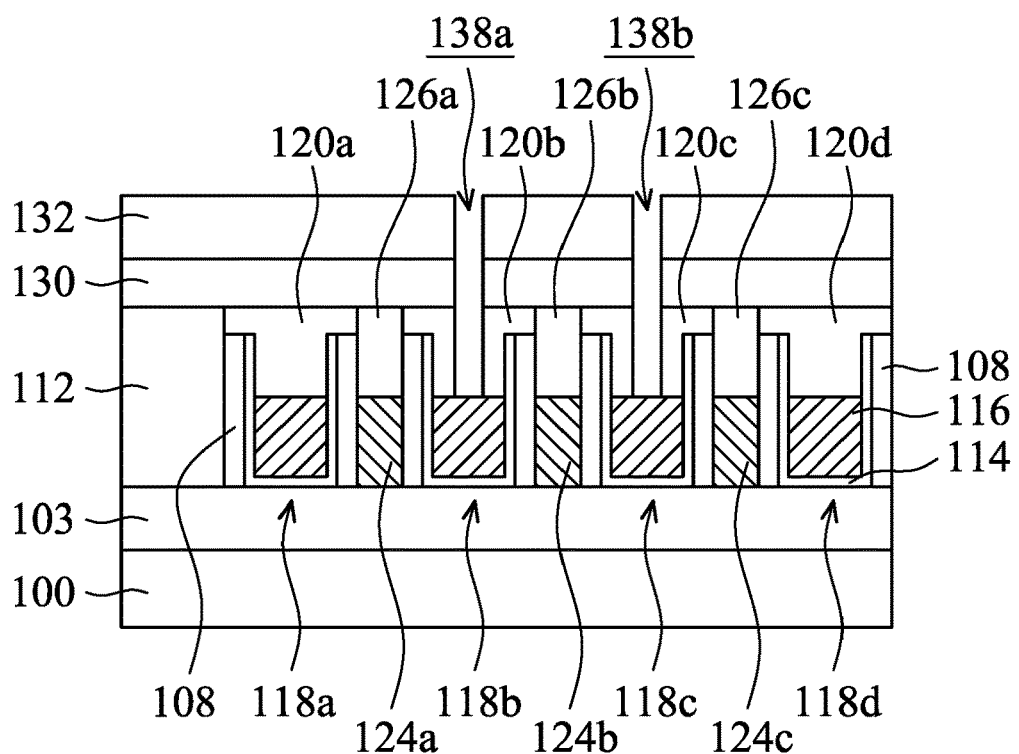
Figure 3E:
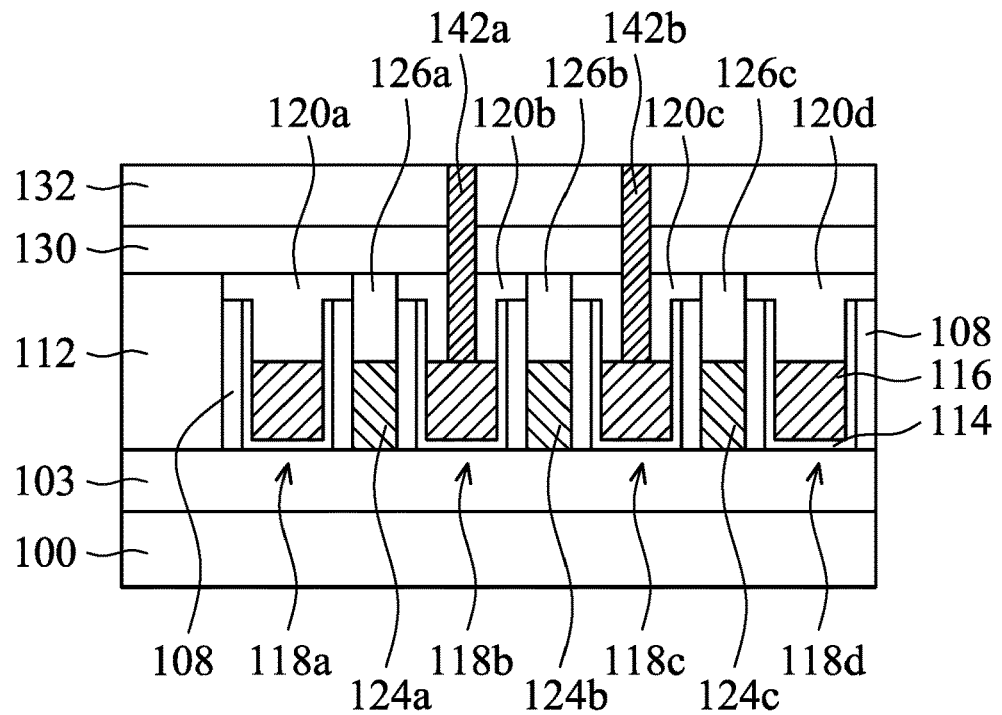

After the formation of the via openings 136a, 136b, 138a, and 138b, metal vias 140a and 140b are formed in the via openings 136a and 136b (not shown and as indicated in FIG. 2D), and metal vias 142a and 142b are formed in the via openings 138a and 138b (not shown and as indicated in FIG. 3D), as respectively shown in FIGS. 2E and 3E in accordance with some embodiments. More specifically, a conductive material (not shown) is formed over the insulating layer 132 and fills the via openings 136a, 136b, 138a, and 138b, in accordance with some embodiments. The conductive material may be made of metal, such as W, Ru, Co, Cu, or another suitable metal material and formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material, so that the insulating layer 132 are exposed and planarized. In some embodiments, the polishing process includes a chemical mechanical polishing (CMP) process. The insulating layer 132 has a top surface that is substantially level with the top surface of the remaining conductive material. After the polishing process, the remaining conductive material forms metal vias 140a, 140b, 142a, and 142b, as shown in FIGS. 2E and 3E in accordance with some embodiments. In some embodiments, the metal vias 140a, 140b, 142a, and 142b has a height that is in a range from about 1 nm to 50 nm, and has a width that is in a range from about 5 nm to 25 nm.

As shown in FIG. 2E, the metal vias 140a and 140b are in direct contact with the source/drain contacts 124a and 124b, respectively, to electrically connect the corresponding source/drain regions 110. Therefore, each of the metal vias 140a and 140b may be referred to as a source/drain via structure. As shown in FIG. 3E, the metal vias 142a and 142b are in direct contact with and electrically connected to the gate electrode layers 116 of the gate structures 118b and 118c. Therefore, each of the metal vias 142a and 142b may be referred to as a gate via structure.

Figure 2F:
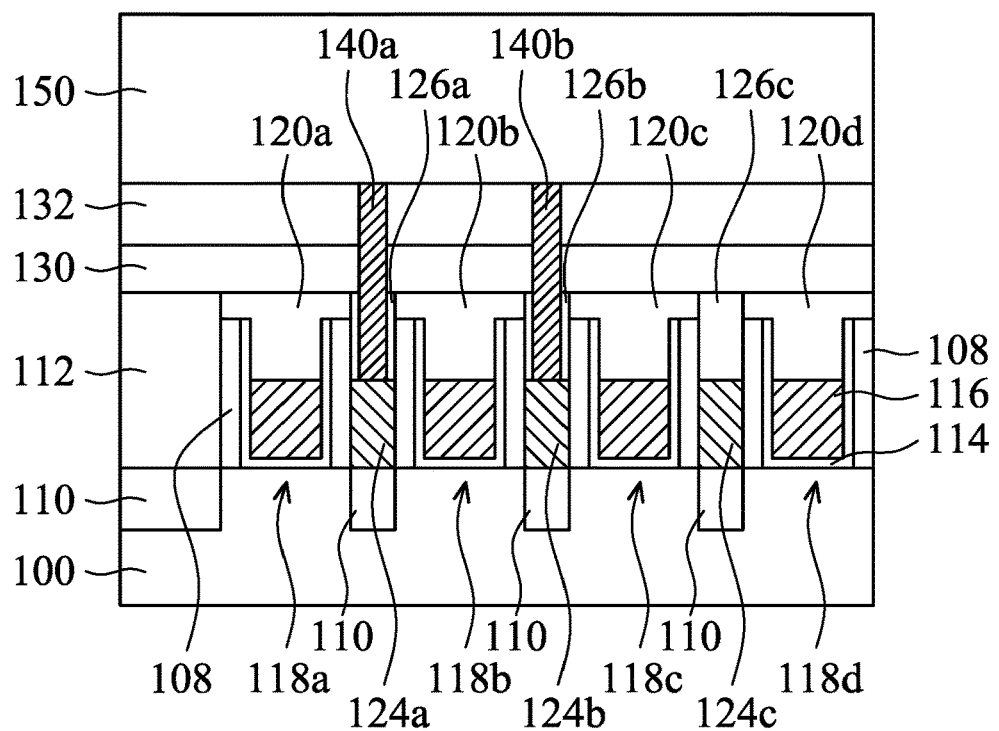
Figure 3F:
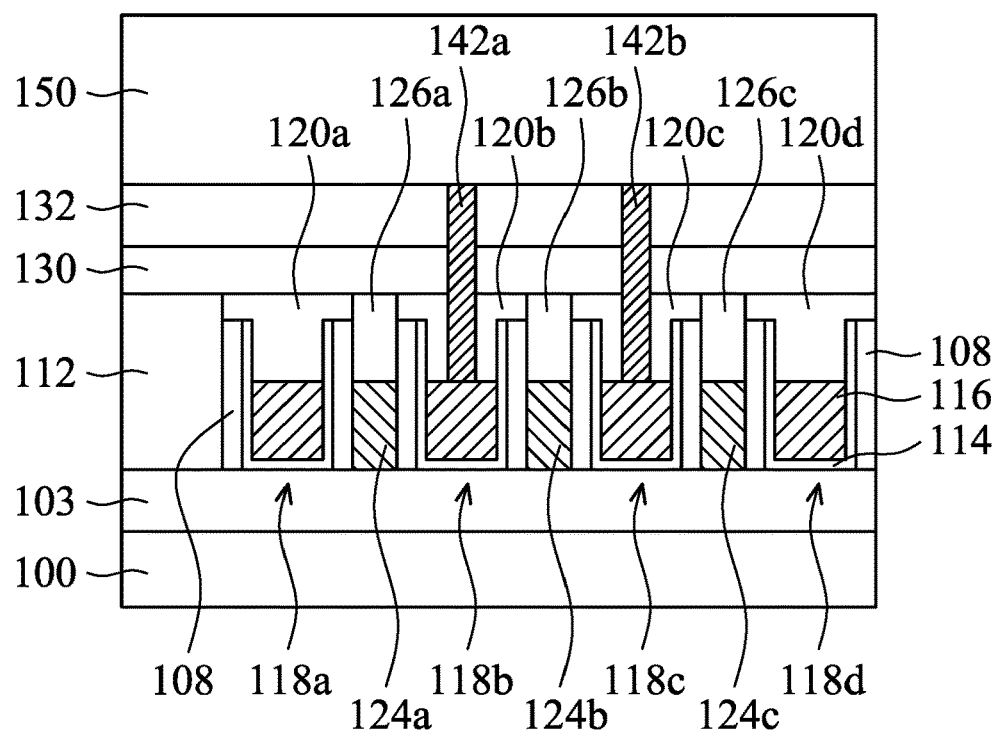

After the formation of metal vias 140a, 140b, 142a, and 142b, an insulating layer 150 is formed over the insulating layer 132 and covers the metal vias 140a, 140b, 142a, and 142b, as shown in FIGS. 2F and 3F in accordance with some embodiments. In some embodiments, the insulating layer 150 serves as an inter-metal dielectric (IMD) layer and is made of SiN, SiCN, SiOC, SiON, SiCN, or SiOCN. The insulating layer 150 may be formed by performing a chemical vapor deposition (CVD) process, a plasma enhanced CVD (PECVD) process, low pressure CVD (LPCVD) process, an atomic layer deposition (ALD) process, or another applicable processes.

Figure 2G:
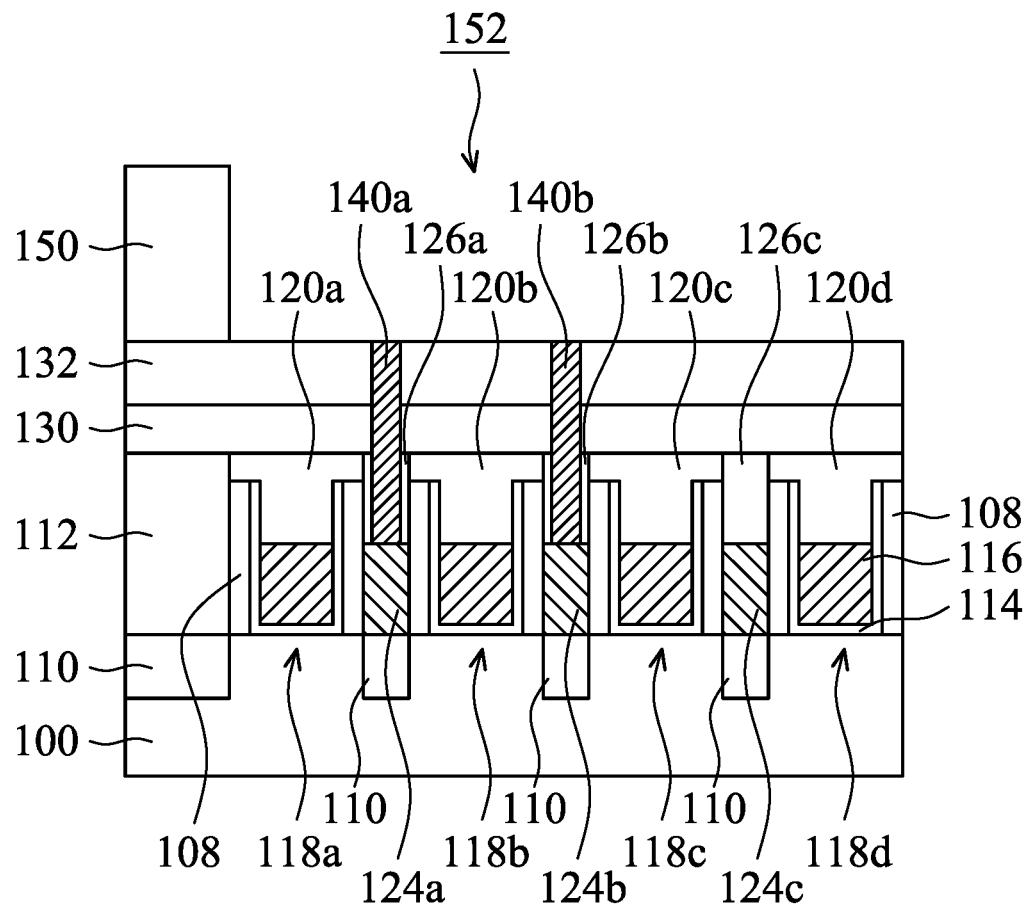
Figure 3G:
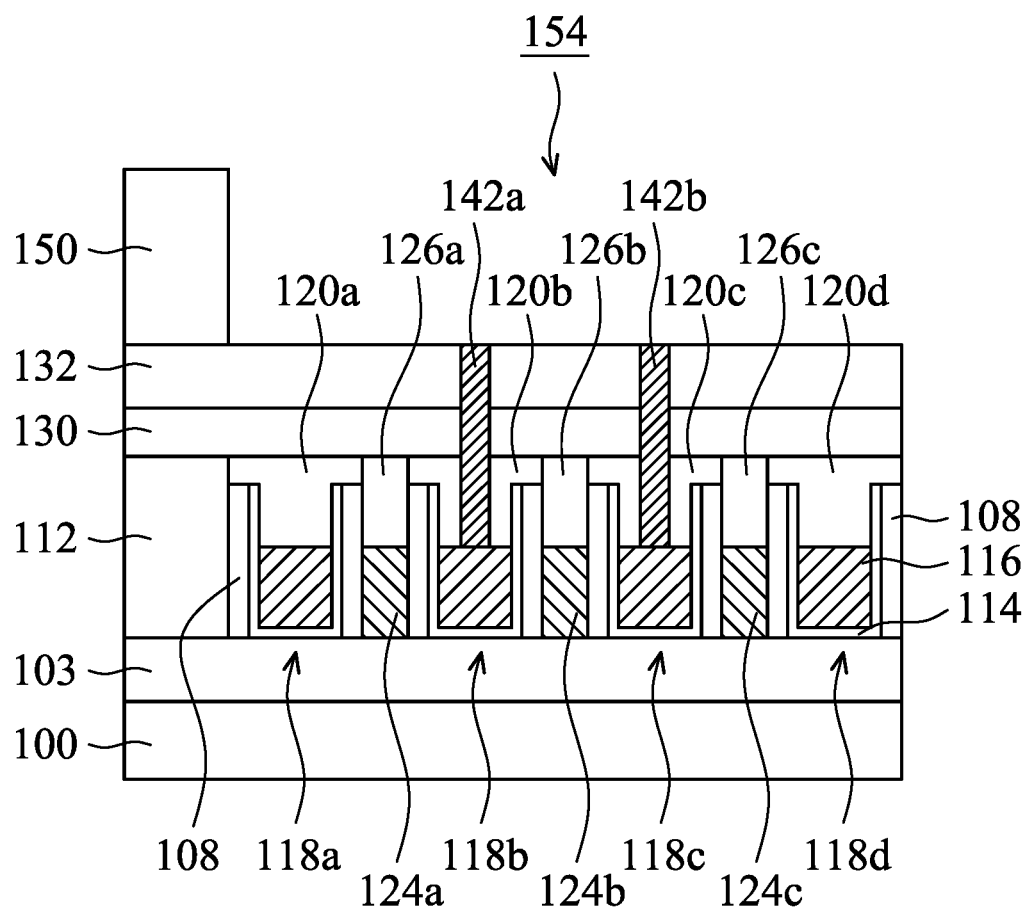

Afterwards, one or more trench openings are formed and pass through the insulating layer 150. In some embodiments, a trench opening 152 that passes through the insulating layer 150 is formed, so as to expose the top surfaces of the metal vias 140a and 140b (i.e., the source/drain via structures), as shown in FIG. 2G. Similarly, a trench opening 154 that passes through the insulating layer 150 is also formed, so as to expose the top surfaces of the metal vias 142a and 142b (i.e., the gate via structures), as shown in FIG. 3G in accordance with some embodiments.

In some embodiments, those trench openings 152 and 154 are formed by performing photolithography and etching processes. For example, an etching process (such as a dry etching process) may be performed using the insulating layer 132 as an etch stop layer after the photolithography process, so that trench openings 152 and 154 through the insulating layer 150 are formed and the insulating layer 132 is exposed.

Figure 2H:
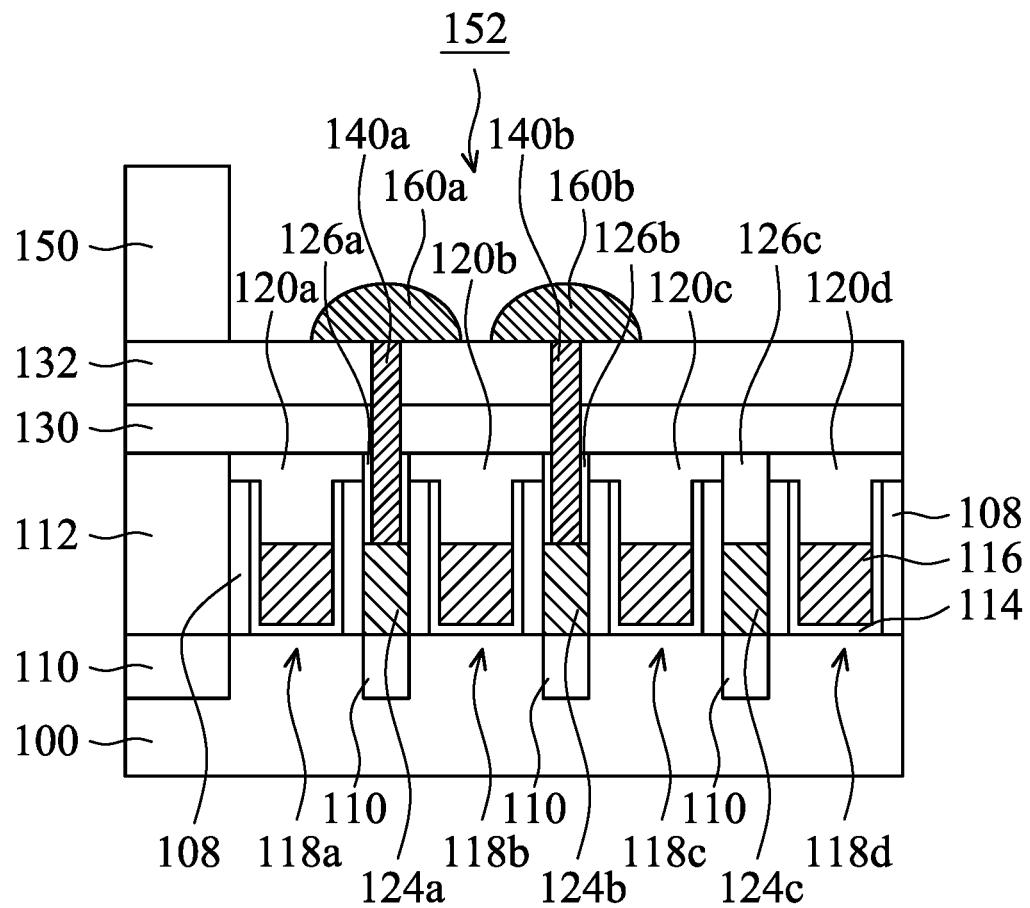
Figure 3H:
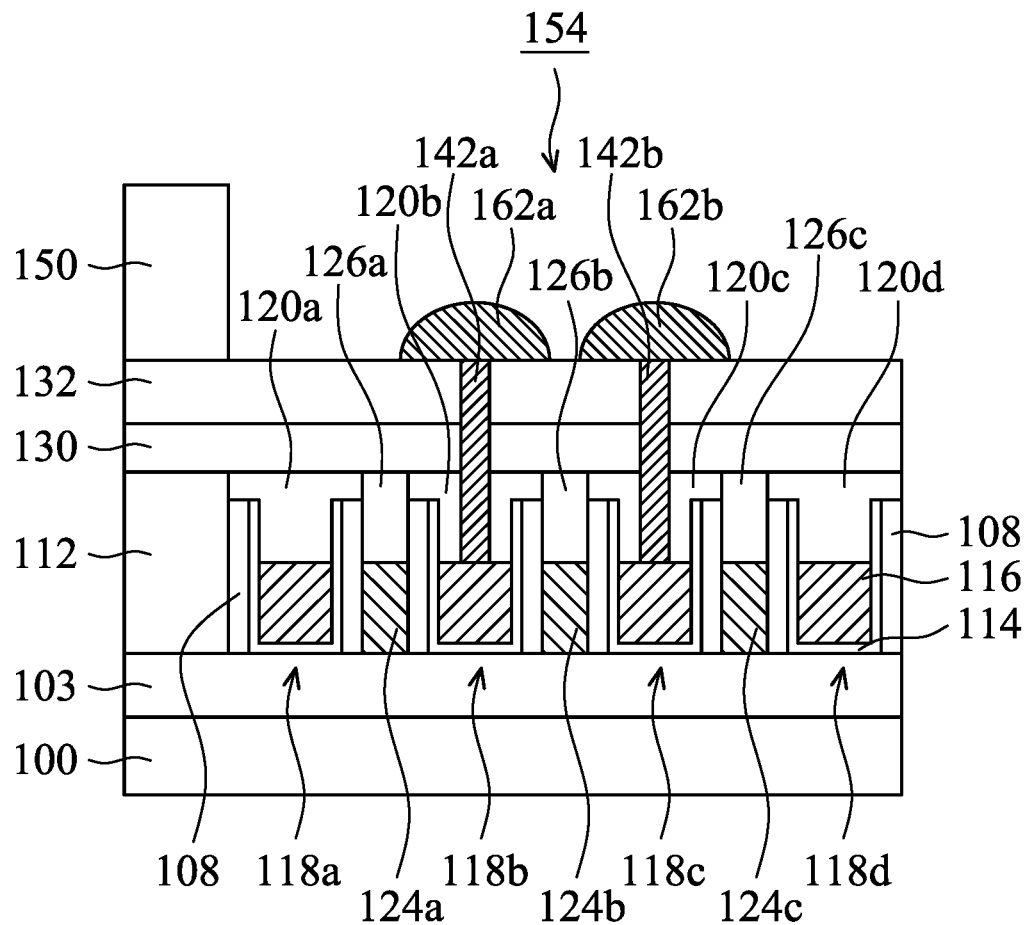

After the trench openings 152 and 154 are formed, selectively growing metal humps from top surfaces of the corresponding metal vias, as shown in FIGS. 2H and 3H in accordance with some embodiments. In some embodiments, metal humps 160a and 160b are formed in the trench opening 152 and surrounded by the insulating layer 150, as shown in FIG. 2H. The formed metal humps 160a and 160b are connected to top surfaces of the metal vias 140a and 140b, respectively. Moreover, the metal humps 160a and 160b cover a portion of the insulating layer 132 adjacent to the corresponding metal vias 140a and 140b. In some embodiments, each of the metal humps 160a and 160b has a convex top surface and a plane bottom surface. The convex top surfaces and the plane bottom surfaces of the metal humps 160a and 160b have an area greater than each of the exposed top surface of the metal vias 140a and 140b. The metal humps 160a and 160b may be made of a material that is the same as or different than the material of the metal vias 140a and 140b. For example, the metal humps 160a and 160b may be made of W, Ru, Co, Cu, or another suitable metal material. The metal humps 160a and 160b may be formed by a selective deposition technology. For example, a metal inhibition layer (not shown), such as an organic film including amphiphilic-like molecules, conformally covers the top surface of the insulating layer 150 and the inner surface of the trench opening 152 and exposes the top surface of the metal vias 140a and 140b. Afterwards, a deposition process (such as a chemical vapor deposition (CVD) process, an atomic layer deposition (ALD) process, an electroless deposition (ELD) process, an electrochemical plating (ECP) process, or another applicable process) may be performed, so that the metal humps 160a and 160b are selectively and directly deposited on and connected to the metal vias 140a and 140b, respectively, due to the formation of the metal inhibition layer. During the formation of the metal humps 160a and 160b, the metal inhibition layer may be consumed. The remaining metal inhibition layer (if presented) may be entirely removed by, for example, plasma dry etching, chemical etching removal, ashing, etching and ashing, or wet etching using high-temperature sulfuric peroxide mixture (SPM) after the formation of the metal humps 160a and 160b. In some embodiments, the metal humps 160a and 160b each is grown to the desired thickness. For example, each of the metal humps 160a and 160b has a height that is less than or substantially equal to 50 nm. In some embodiments, the metal humps 160a and 160b are spaced apart from each other.

Similarly, metal humps 162a and 162b are formed in the trench opening 154 and surrounded by the insulating layer 150, as shown in FIG. 3H. The formed metal humps 162a and 162b are connected to top surfaces of the metal vias 142a and 142b, respectively. Moreover, the metal humps 162a and 162b cover a portion of the insulating layer 132 adjacent to the corresponding metal vias 142a and 142b. In some embodiments, the metal humps 1602a and 162b each also has a convex top surface and a plane bottom surface that have an area greater than each of the exposed top surface of the metal vias 142a and 142b. The material and the method used for the formation of the metal humps 162a and 162b are the same as those used for the formation of the metal humps 160a and 160b. In some embodiments, the metal humps 162a and 162b are formed during the formation of the metal humps 160a and 160b. In some embodiments, the metal humps 162a and 162b each is grown to the desired thickness. For example, each of the metal humps 162a and 162b has a height that is less than or substantially equal to 50 nm. In some embodiments, the metal humps 162a and 162b are also spaced apart from each other.

Figure 2I:
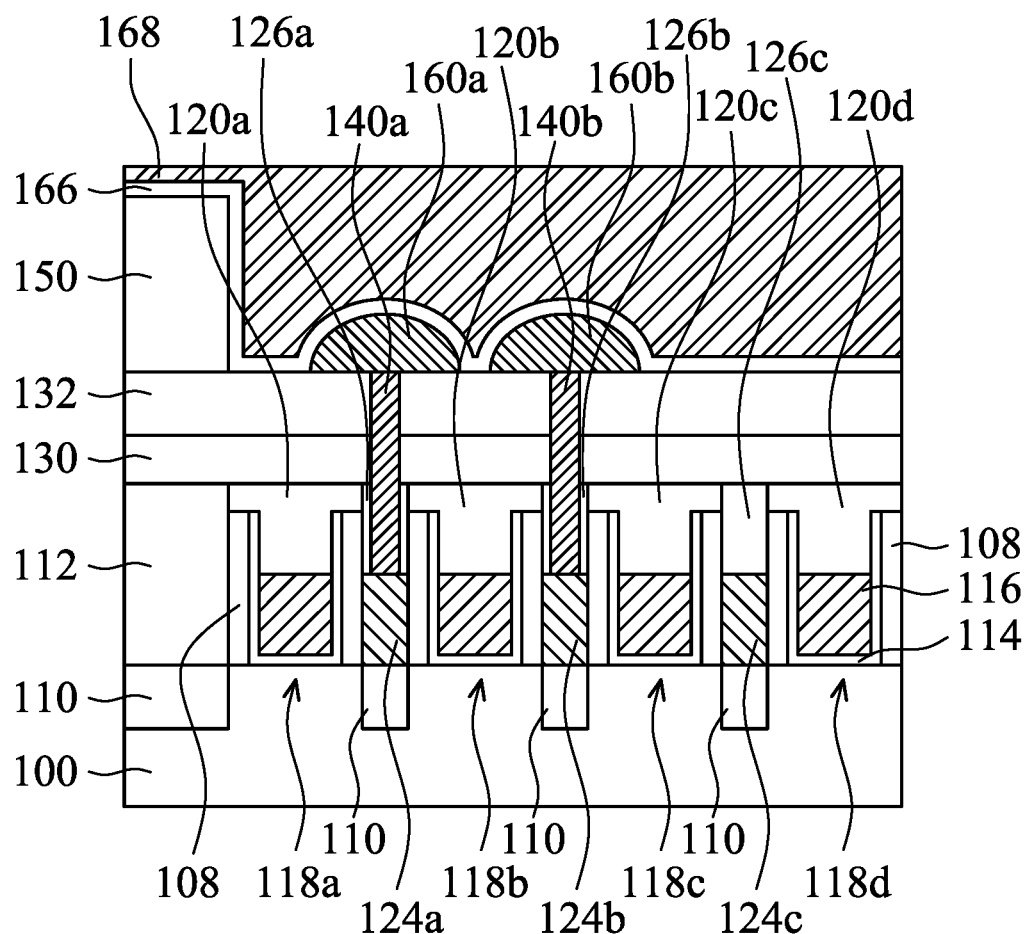
Figure 3I:
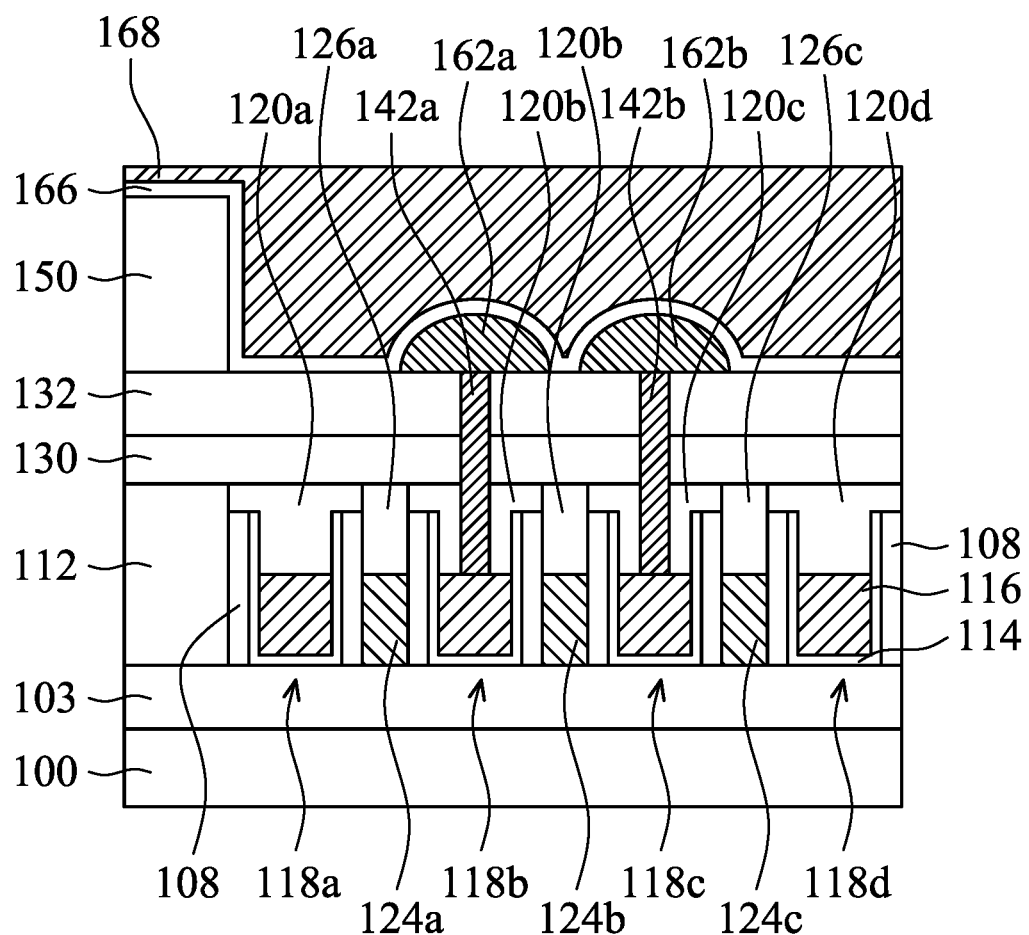

After the formation of the metal humps 160a, 160b, 162a, and 162b, a conformal conductive layer 166 and a fill metal material 168 are successively formed over the insulating layer 150 and fills the trench opening 152 (not shown and as indicated in FIG. 211) and the trench opening 154 (not shown and as indicated in FIG. 3H), as shown in FIGS. 2I and 3I in accordance with some embodiments. In some embodiments, the conformal conductive layer 166 covers the metal humps 160a, 160b, 162a, and 162b and separates the fill metal material 168 from the insulating layer 150 and the metal humps 160a, 160b, 162a, and 162b.

In some embodiments, the conformal conductive layer 166 is made of or includes TaN, TiN, TiO, TaO, TiSiN, or a combination thereof. In some embodiments, the conformal conductive layer 166 is formed using a chemical vapor deposition (CVD) process, an atomic layer deposition (ALD) process, a physical vapor deposition (PVD) process, one or more other applicable processes, or a combination thereof.

In some embodiments, the fill metal material 168 and the conformal conductive layer 166 are made of different materials. In some embodiments, the fill metal material 168 is made of or includes Cu, Co, Ru, W, one or more other suitable materials, or a combination thereof. In some embodiments, the fill metal material 168 is formed using an electroplating process, a physical vapor deposition (PVD) process, a chemical vapor deposition (CVD) process, an electroless plating process, one or more other applicable processes, or a combination thereof.

The conformal conductive layer 166 with a sufficient thickness (for example, in a range from about 3 nm to 20 nm) can protect the insulating layer 150 from diffusion of metal atoms from the fill metal material 168 during subsequent thermal processes or cycles. Moreover, the conformal conductive layer 166 may serve as a glue layer to enhance the adhesion between the insulating layer 150 and the fill metal material 168, thereby preventing the fill metal material 168 from peeling during the subsequent planarization process.

Although the conformal conductive layer 166 can improve the reliability of the fill metal material 168, the interface resistance between the metal vias 140a, 140b, 142a, and 142b and the subsequently formed conductive feature (which includes the conformal conductive layer 166 and the fill metal material 168) is increased due to high resistance of the conformal conductive layer 166 and small size of the metal vias 140a, 140b, 142a, and 142b. However, as mentioned, each of the metal humps 160a, 160b, 162a, and 162b having a convex top surface and a plane bottom surface helps to increase the contact area between the metal vias 140a, 140b, 142a, and 142b and the subsequently formed conductive feature, so as to reduce the contact resistance between the metal vias 140a, 140b, 142a, and 142b and the subsequently formed conductive feature. Therefore, the reliability of the subsequently formed conductive feature can be improved while reducing the interface resistance between the metal vias 140a, 140b, 142a, and 142b and the subsequently formed conductive feature.

Figure 4:
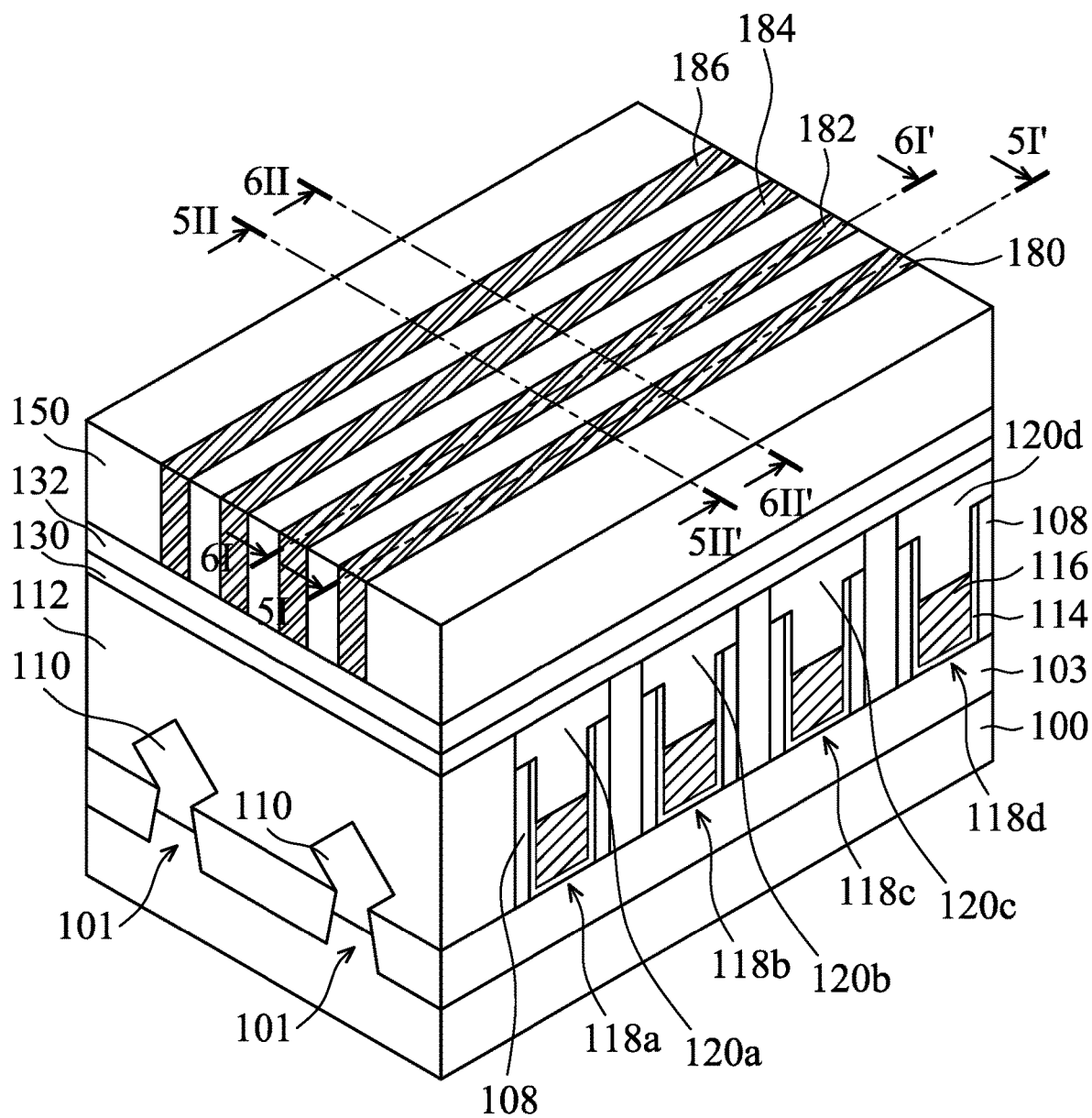
FIG. 4 illustrates a perspective view of a semiconductor device structure in accordance with some embodiments.
Figure 5A:
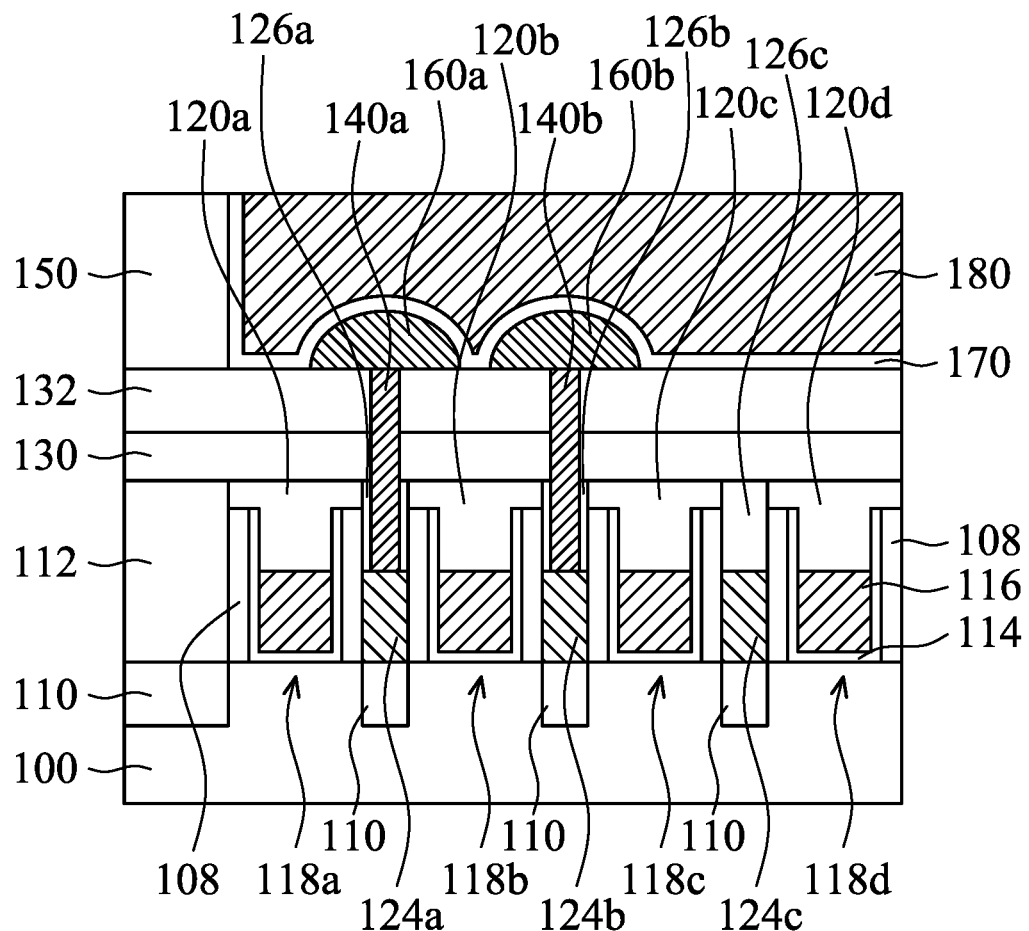
FIG. 5A illustrates a cross-sectional representation of a semiconductor device structure in accordance with some embodiments.
Figures 1, 5A:
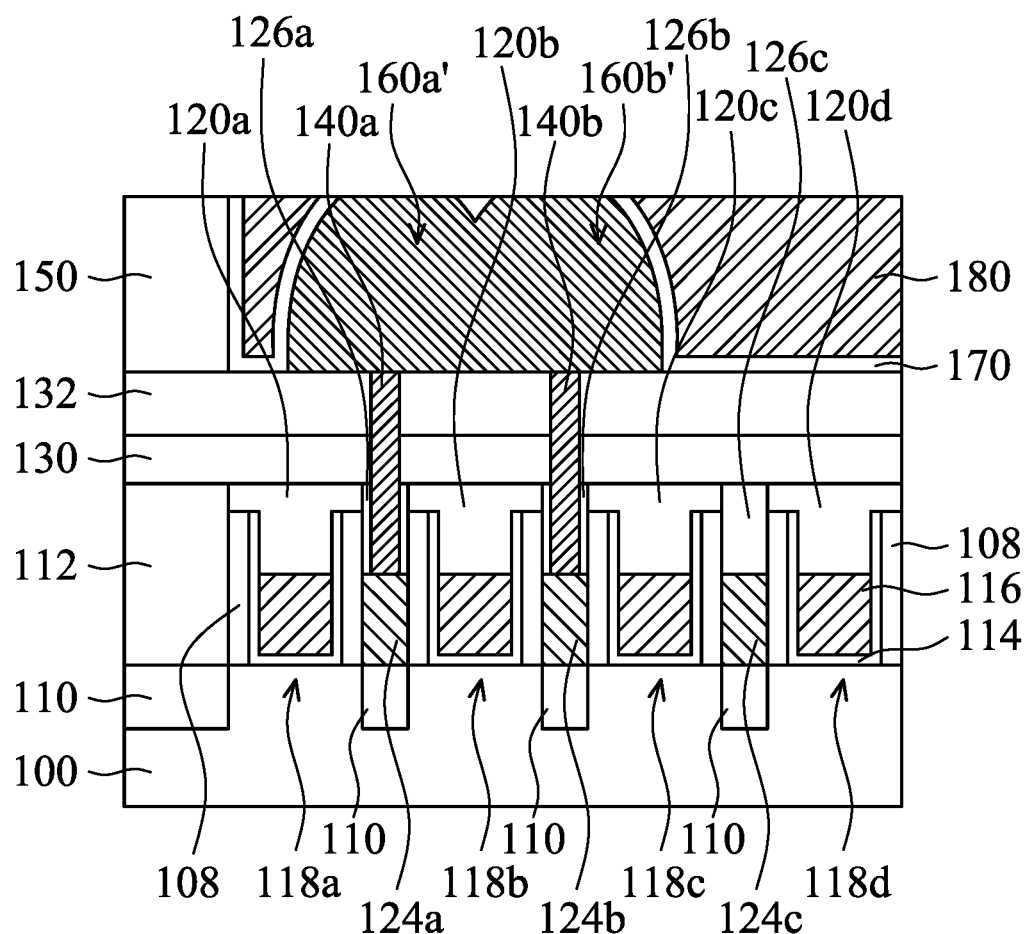
Figures 2, 5A:
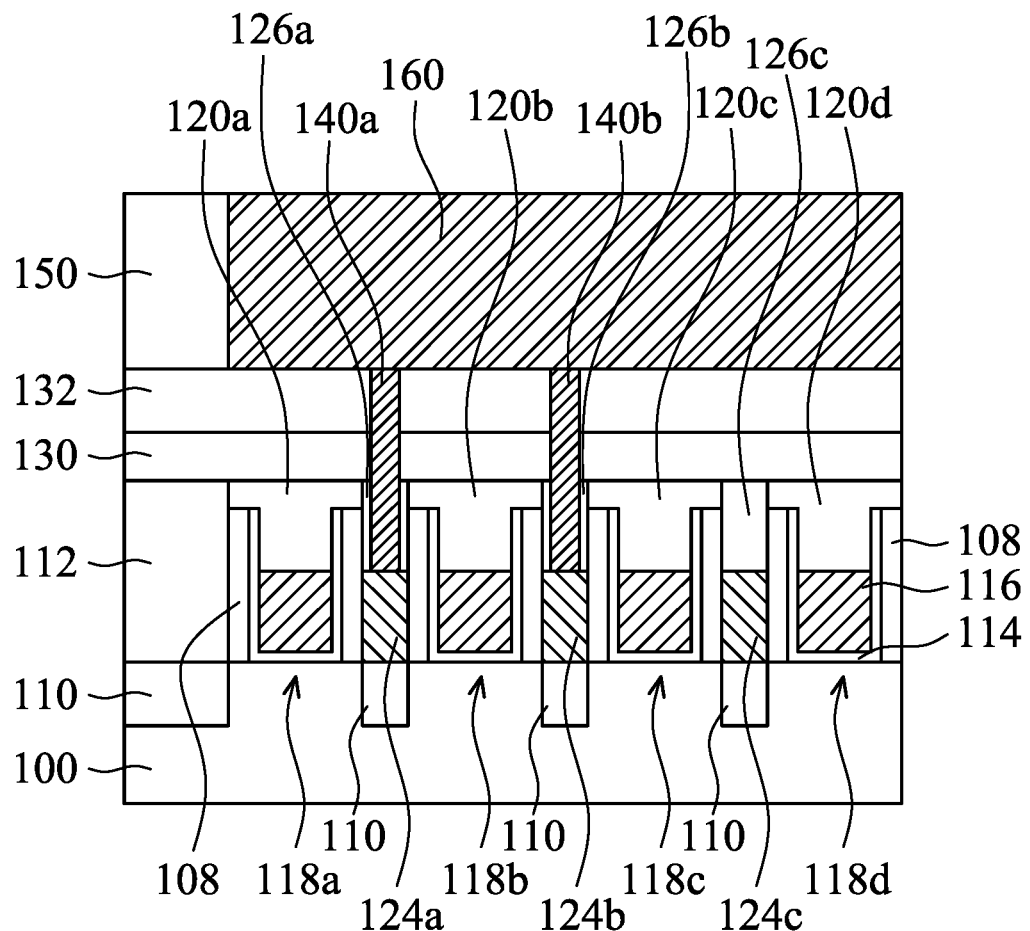
Figure 5B:
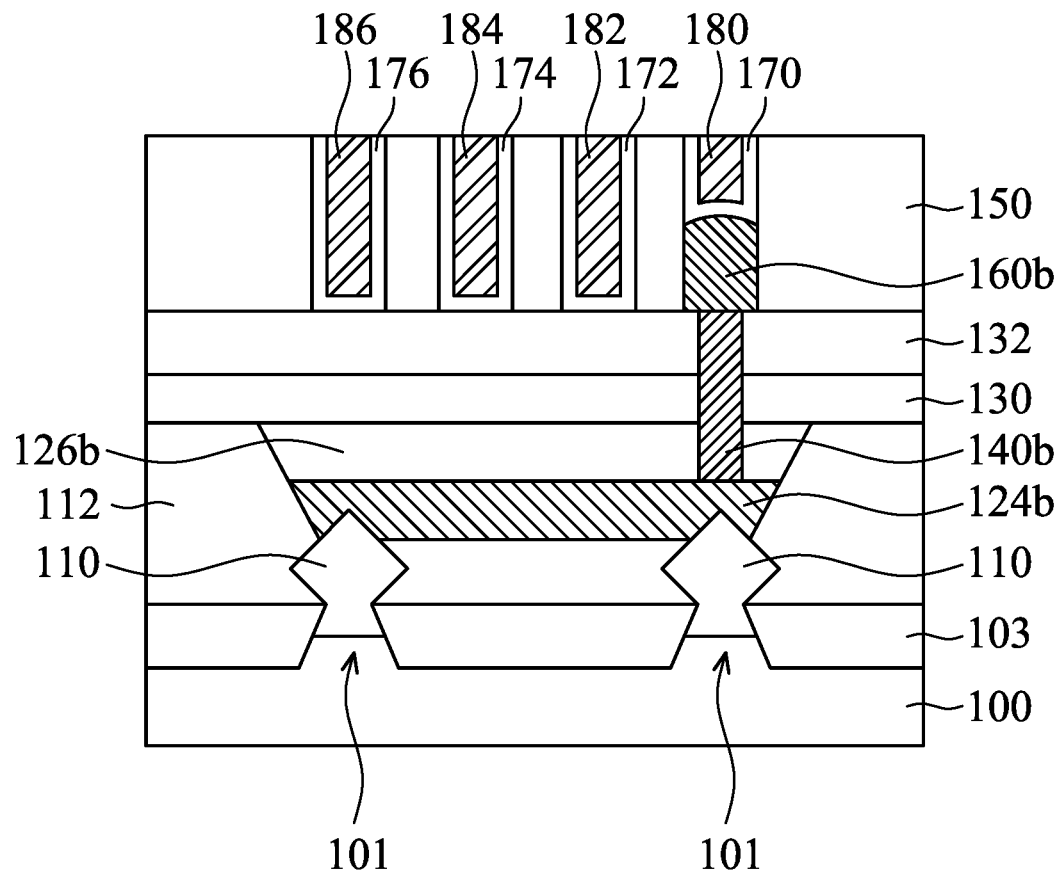
FIG. 5B illustrates a cross-sectional representation of a semiconductor device structure in accordance with some embodiments.
Figure 6A:
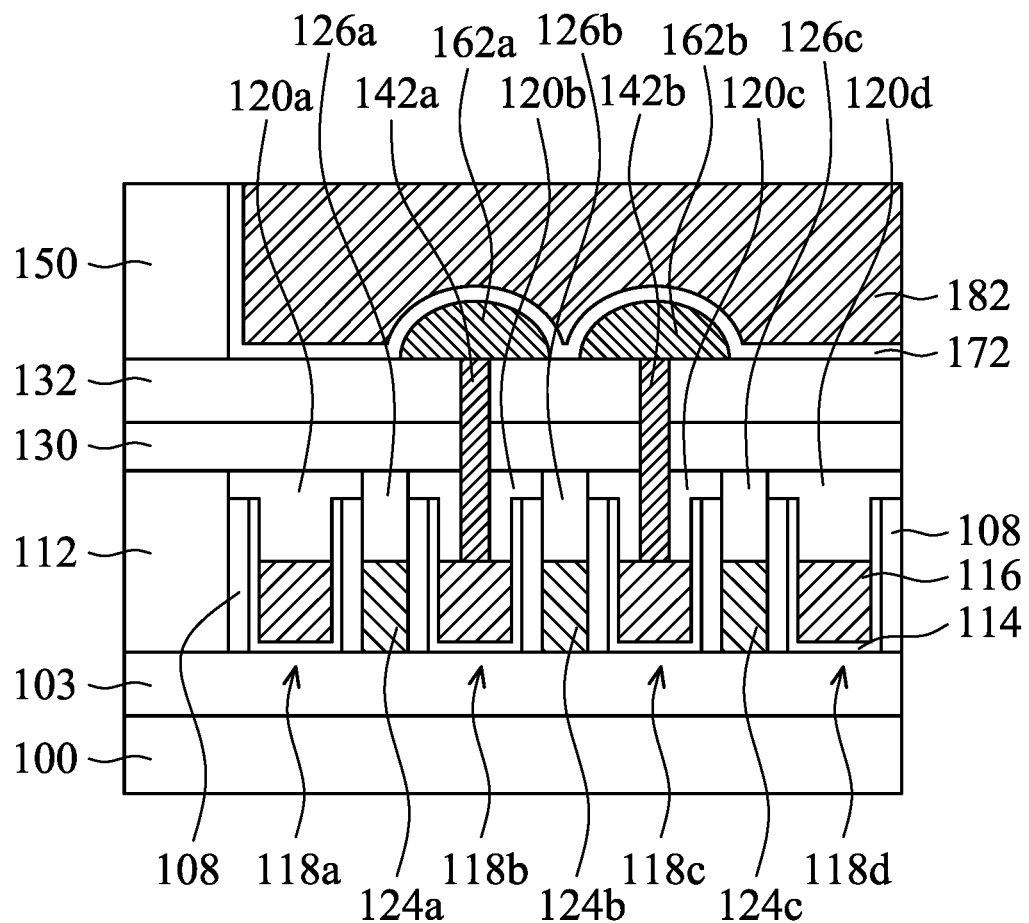
FIG. 6A illustrates a cross-sectional representation of a semiconductor device structure in accordance with some embodiments.
Figures 1, 6A:
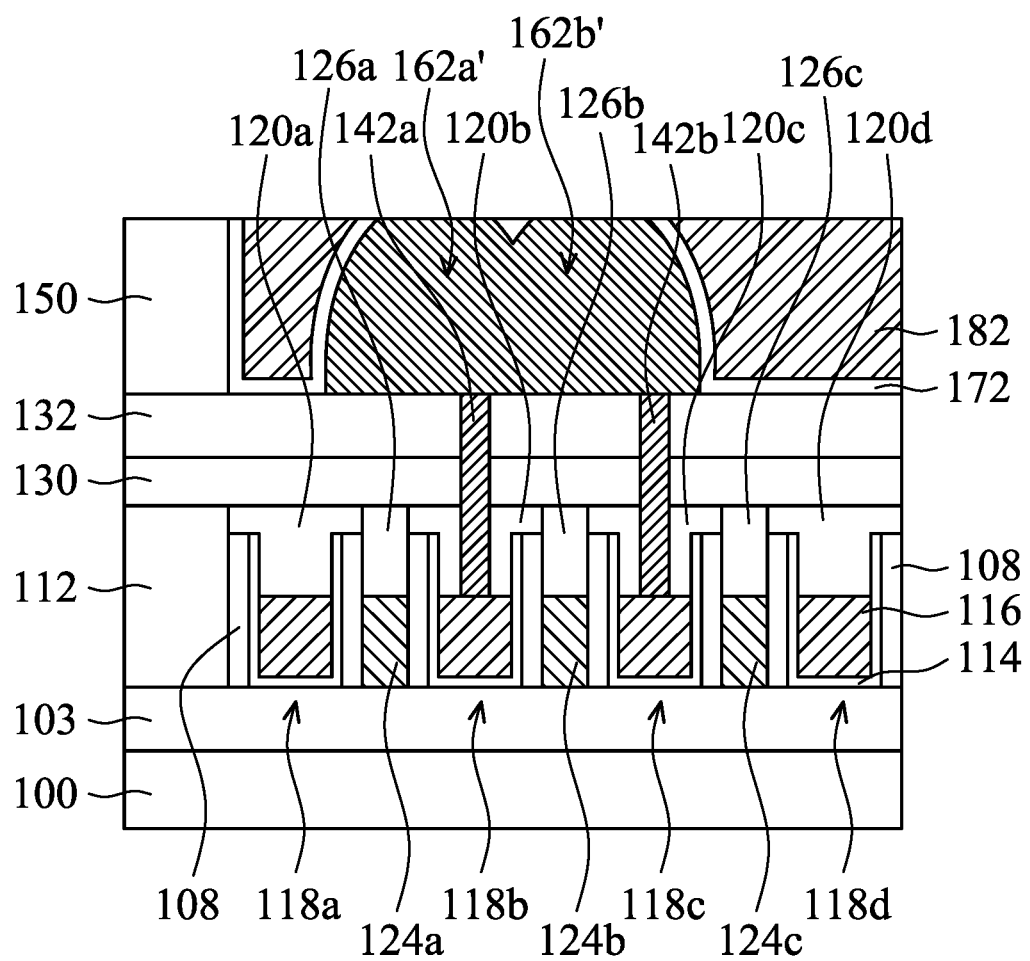
Figures 2, 6A:
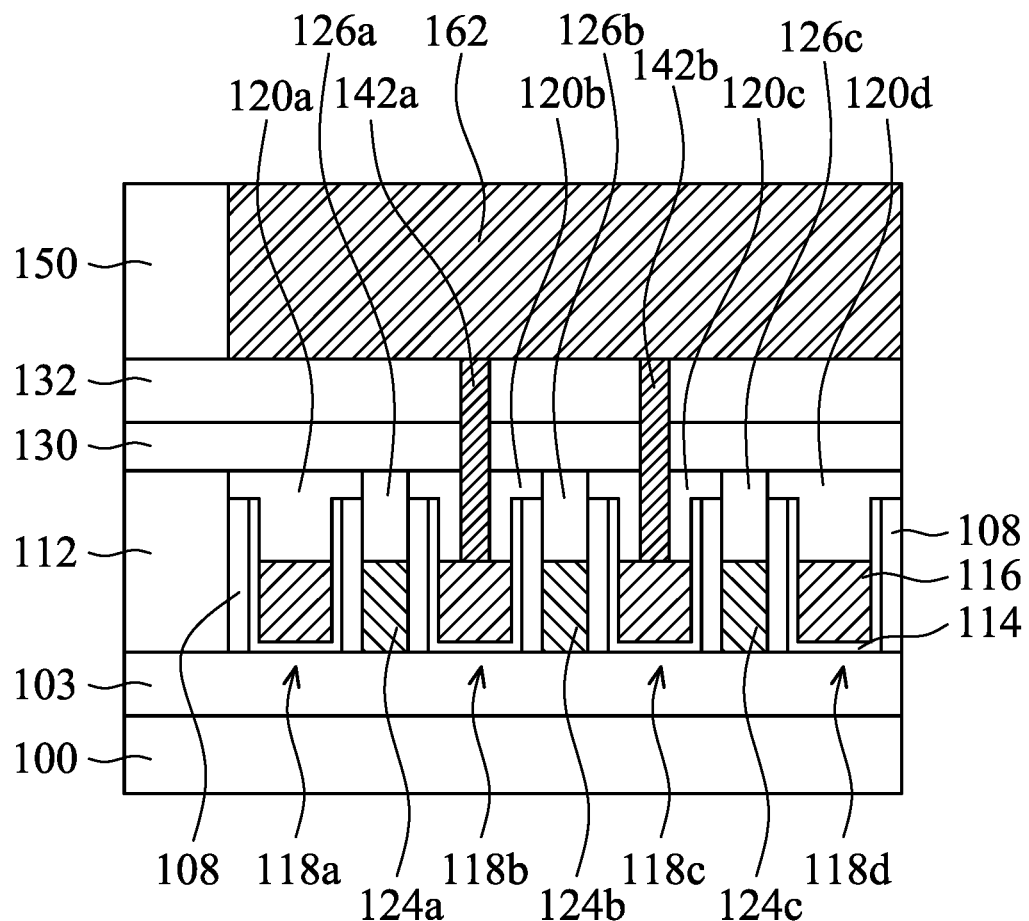
Figure 6B:
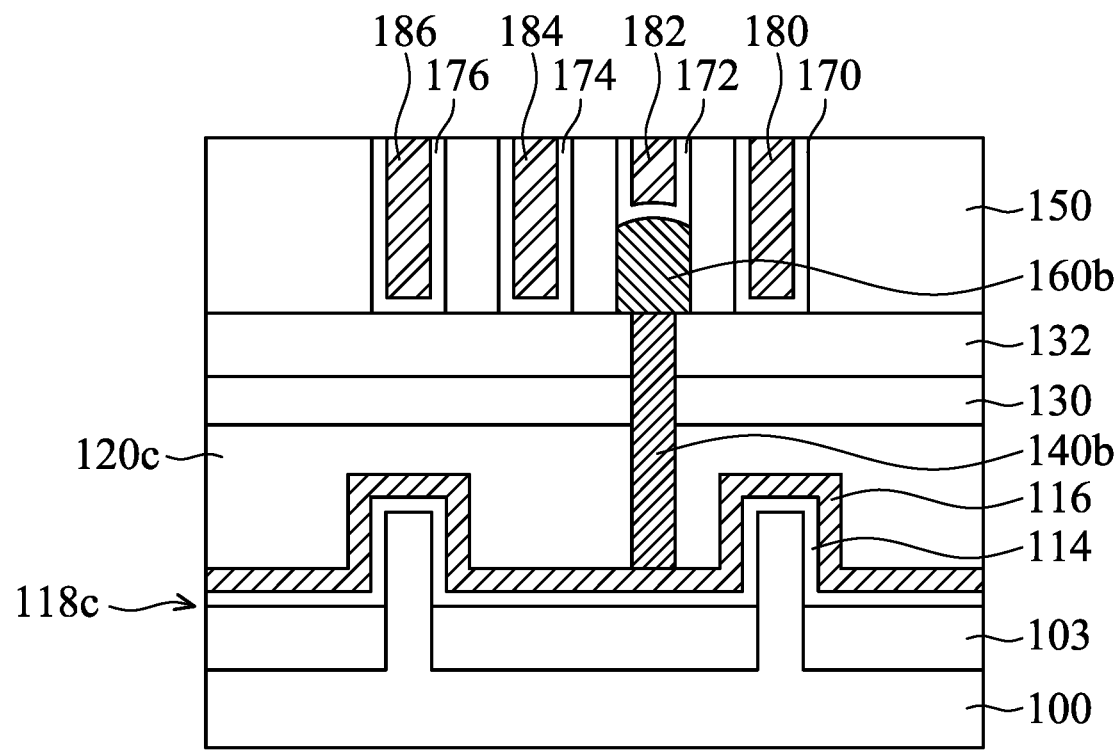
FIG. 6B illustrates a cross-sectional representation of a semiconductor device structure in accordance with some embodiments.

After the conformal conductive layer 166 and the fill metal material 168 shown in FIGS. 2I and 3I are formed, a planarization process is performed, as shown in FIGS. 4, 5A, 5B, 6A, and 6B in accordance with some embodiments. FIG. 4 illustrates a perspective view of a semiconductor device structure in accordance with some embodiments. FIG. 5A is cross-sectional representation taken along 5I-5I' line of FIG. 4. FIG. 5B is cross-sectional representation taken along 5II-5II' line of FIG. 4. FIG. 6A is cross-sectional representation taken along 6I-6I' line of FIG. 4. FIG. 6B is cross-sectional representation taken along 6II-6II' line of FIG. 4.

In some embodiments, the planarization process removes the conformal conductive layer 166 and the fill metal material 168 above the insulating layer 150. The remaining portions of the conformal conductive layer 166 and the fill metal material 168 in the trench openings of the insulating layer 150 to form a metal line 180 with a conductive liner 170, a metal line 182 with a conductive liner 172, a metal line 184 with a conductive liner 174, and a metal line 186 with a conductive liner 176, as shown in FIGS. 4, 5B, and 6B. In some embodiments, the planarization process includes a chemical mechanical polishing (CMP) process. The formed metal lines 180, 182, 184, and 186 may have a height that is in a range from about 1 nm to 50 nm.

In some embodiments, the metal line 180 is electrically connected to the metal vias 140a and 140b, and the conductive liner 170 is formed between metal hump 160a from the metal hump 160b to separate the metal hump 160a from the metal hump 160b, as shown in FIG. 5A. Moreover, the conductive liner 170 covers the metal humps 160a and 160b and separates the metal line 180 from the insulating layer 150 and the metal humps 160a and 160b, as shown in FIG. 5B.

FIG. 5A-1 illustrates a cross-sectional representation of a semiconductor device structure in accordance with some embodiments. The semiconductor device structure shown in FIG. 5A-1 is similar to the semiconductor device structure shown in FIG. 5A. In some embodiments, the materials, formation methods, and/or benefits of the semiconductor device structure shown in FIG. 5A may also be applied in the embodiments illustrated in FIG. 5A-1, and are therefore not repeated. Unlike the metal humps 160a and 160b in the semiconductor device structure shown in FIG. 5A, the metal humps 160a' and 160b' in the semiconductor device structure shown in FIG. 5A-1 are laterally merged with each other, in accordance with some embodiments.

FIG. 5A-2 illustrates a cross-sectional representation of a semiconductor device structure in accordance with some embodiments. The semiconductor device structure shown in FIG. 5A-2 is similar to the semiconductor device structure shown in FIG. 5A. In some embodiments, the materials, formation methods, and/or benefits of the semiconductor device structure shown in FIG. 5A may also be applied in the embodiments illustrated in FIG. 5A-2, and are therefore not repeated. Unlike the metal humps 160a and 160b in the semiconductor device structure shown in FIG. 5A, the metal humps (nor shown) in the semiconductor device structure shown in FIG. 5A-2 are laterally merged with each other and completely fill the trench opening (not shown) that is formed in the insulating layer 150, in accordance with some embodiments. In those cases, the merged metal hump 160 serves as a metal line connected to the metal vias 140a and 140b, and therefore the steps for the formation of the conformal conductive layer and the fill metal material can be skipped. That is, the interface resistance between the metal line (that is formed of the merged metal hump 160) and the metal vias 140a and 140b can be greatly reduced.

In some embodiments, the metal line 182 is electrically connected to the metal vias 142a and 142b, and the conductive liner 172 is formed between metal hump 162a from the metal hump 162b to separate the metal hump 162a from the metal hump 162b, as shown in FIG. 6A. Moreover, the conductive liner 172 covers the metal humps 162a and 162b and separates the metal line 182 from the insulating layer 150 and the metal humps 162a and 162b, as shown in FIG. 6B.

FIG. 6A-1 illustrates a cross-sectional representation of a semiconductor device structure in accordance with some embodiments. The semiconductor device structure shown in FIG. 6A-1 is similar to the semiconductor device structure shown in FIG. 6A. In some embodiments, the materials, formation methods, and/or benefits of the semiconductor device structure shown in FIG. 6A may also be applied in the embodiments illustrated in FIG. 6A-1, and are therefore not repeated. Unlike the metal humps 162a and 162b in the semiconductor device structure shown in FIG. 6A, the metal humps 162a' and 162b' in the semiconductor device structure shown in FIG. 6A-1 are laterally merged with each other, in accordance with some embodiments.

FIG. 6A-2 illustrates a cross-sectional representation of a semiconductor device structure in accordance with some embodiments. The semiconductor device structure shown in FIG. 6A-2 is similar to the semiconductor device structure shown in FIG. 6A. In some embodiments, the materials, formation methods, and/or benefits of the semiconductor device structure shown in FIG. 6A may also be applied in the embodiments illustrated in FIG. 6A-2, and are therefore not repeated. Unlike the metal humps 162a and 162b in the semiconductor device structure shown in FIG. 6A, the metal humps (nor shown) in the semiconductor device structure shown in FIG. 6A-2 are laterally merged with each other and completely fill the trench opening (not shown) that is formed in the insulating layer 150, in accordance with some embodiments. In those cases, the merged metal hump 162 serves as a metal line connected to the metal vias 142a and 142b, and therefore the steps for the formation of the conformal conductive layer and the fill metal material can be skipped. That is, the interface resistance between the metal line (that is formed of the merged metal hump 162) and the metal vias 142a and 142b can be greatly reduced.

Embodiments of semiconductor device structures and methods for forming the same are provided. The formation of the semiconductor device structure includes forming a metal via in a first insulating layer. Afterwards, a metal hump is selectively formed over the top surface of the metal via and surrounded by the second insulating layer. Afterwards, a conductive liner is formed in the second insulting layer to cover the metal hump, and a metal line is formed over the conductive liner in the second insulting layer. The metal hump has a convex top surface and a plane bottom surface each of which has an area greater than the exposed top surface of the metal via. Therefore, the metal via with the metal hump thereon can provide a greater contact area for the metal line than the metal via without the metal hump formed thereon. As a result, the interface resistance between the conductive liner and the metal via can be reduced, thereby mitigating the electric current crowding. Accordingly, the device's performance can be improved.

In some embodiments, a method for forming a semiconductor device structure is provided. The method includes forming a first insulating layer over a substrate, forming a first metal feature in the first insulating layer, and forming a second insulating layer over the first insulating layer. The method also includes forming a first metal via through the second insulating layer to connect the first metal feature. The method further includes forming a second metal feature over the second insulating layer. The second metal feature has a convex top surface and a plane bottom surface, and the plane bottom is electrically connected to the first metal feature through the first metal via.

In some embodiments, a method for forming a semiconductor device structure is provided. The method includes forming a first gate electrode layer and a first source/drain contact over a substrate and forming a first metal via to connect the first gate electrode layer, and a second metal via to connect the first source/drain contact. The method also includes forming an organic film including amphiphilic-like molecules as a metal inhibition layer, to cover a top surface of the first metal via and a top surface of the second metal via. The method further includes growing a first metal hump from a top surface of the first metal via and a second metal hump from a top surface of the second metal via by a deposition process using the metal inhibition layer.

In some embodiments, a method for forming a semiconductor device structure is provided. The method includes forming a first insulating layer over a substrate having a fin structure, forming a first gate electrode layer in the first insulating layer and across the fin structure, and forming a first source/drain contact electrically connected to the first source/drain region in the fin structure. The method also includes forming a second insulating layer over the first insulating layer and etching the second insulating layer to form a first via opening exposing the first gate electrode layer and a second via opening exposing the first source/drain contact. The method further includes forming a first metal via in the first via opening to connect the first gate electrode layer, and a second metal via in the second via opening to connect the first source/drain contact. In addition, the method includes forming a third insulating layer over the second insulating layer and etching the third insulating layer to form a first trench opening exposing the first metal via, and a second trench opening exposing the second metal via. The method also includes selectively growing a first metal hump from the top surface of the first metal via and a second metal hump from the top surface of the second metal via.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first insulating layer over a substrate;
   forming a first metal feature in the first insulating layer;
   forming a second insulating layer over the first insulating layer;
   forming a first metal via through the second insulating layer to connect the first metal feature; and
   forming a second metal feature over the second insulating layer, wherein the second metal feature has a convex top surface and wherein an interface between the second metal feature and the second insulating layer is substantially and horizontally aligned to an interface between the second metal feature and the first metal via.

2. The method as claimed in claim 1, further comprising:
   forming a third insulating layer over the second insulating layer prior to the formation of the second metal feature, wherein the third insulating layer has an opening that exposes the first metal via; and
   forming a metal line in the opening to cover the second metal feature.

3. The method as claimed in claim 1, further comprising:
forming a third metal feature in the first insulating layer;
forming a second metal via through the second insulating layer to connect the third metal feature; and
forming a fourth metal feature over the second insulating layer, wherein the fourth metal feature has a convex top surface and a plane bottom surface, and the plane bottom of the fourth metal feature is electrically connected to the third metal feature through the second metal via.

4. The method as claimed in claim 3, further comprising forming a conductive liner to cover the convex top surface of the second metal feature and the convex top surface of the fourth metal feature.

5. The method as claimed in claim 4, wherein a portion of the conductive liner separates the second metal feature from the fourth metal feature.

6. The method as claimed in claim 3, wherein the second metal feature and the fourth metal feature are laterally merged with each other.

7. The method as claimed in claim 6, further comprising forming a third insulating layer over the second insulating layer prior to the formation of the second metal feature and the fourth metal feature,
wherein the third insulating layer has an opening that exposes the first metal via and the second metal via; and
wherein the second metal feature and the fourth metal feature are completely fill the opening in the opening of the third insulating layer.

8. The method as claimed in claim 3, wherein both the first metal feature and the third metal feature are source/drain contacts or gate electrode layers.

9. A method for forming a semiconductor device structure, comprising:
forming a first gate electrode layer and a first source/drain contact over a substrate;
forming a first metal via to connect the first gate electrode layer, and a second metal via to connect the first source/drain contact;
forming an organic film including amphiphilic-like molecules as a metal inhibition layer over the first gate electrode layer and the first source/drain contact, wherein the organic film exposes a top surface of the first metal via and a top surface of the second metal via; and
growing a first metal feature with a convex top surface from the exposed top surface of the first metal via and a second metal feature with a convex top surface from the exposed top surface of the second metal via by a deposition process using the metal inhibition layer.

10. The method as claimed in claim 9, further comprising:
forming a second gate electrode layer and a second source/drain contact over the substrate; and
forming a third metal via to connect the second gate electrode layer, and a fourth metal via to connect the second source/drain contact before forming the organic film, wherein the organic film exposes a top surface of the third metal via and a top surface of the fourth metal via; and
growing a third metal feature with a convex top surface from the exposed top surface of the third metal via and a fourth metal feature with a convex top surface from the exposed top surface of the fourth metal via by the deposition process using the metal inhibition layer,
wherein each of the first metal bump, the second metal bump, the third metal bump, and the fourth metal bump has a bottom area greater than a top area of each of the first metal via, the second metal via, the third metal via, and the fourth metal via.

11. The method as claimed in claim 10, further comprising:
forming a first conductive liner to cover the convex top surface of the first metal feature and the convex top surface of the third metal feature, and a second conductive liner to cover the convex top surface of the second metal feature and the convex top surface of the fourth metal feature; and
forming a first metal line over the first conductive liner and a second metal line over the second conductive liner.

12. The method as claimed in claim 11, wherein a portion of the first conductive liner is sandwiched between the first metal feature and the third metal feature, and a portion of the second conductive liner is sandwiched between the second metal feature and the fourth metal feature.

13. The method as claimed in claim 10, wherein the first metal feature and the third metal feature are laterally merged with each other and the second metal feature and the fourth metal feature are laterally merged with each other.

14. The method as claimed in claim 10, further comprising:
forming an insulating layer over the substrate,
wherein the insulating layer has a first opening that expose top surfaces of the first metal via and the third metal via, and a second opening that expose the top surfaces of the second metal via and the fourth metal via; and
wherein the first metal feature and the third metal feature are grown until the first opening is completely filled, and the third second metal feature and the fourth metal feature are grown until the second opening is completely filled.

15. A method for forming a semiconductor device structure, comprising:
forming a first insulating layer over a substrate having a fin structure;
forming a first gate electrode layer in the first insulating layer and across the fin structure;
forming a first source/drain contact electrically connected to a first source/drain region in the fin structure;
forming a second insulating layer over the first insulating layer;
etching the second insulating layer to form a first via opening exposing the first gate electrode layer and a second via opening exposing the first source/drain contact;
forming a first metal via in the first via opening to connect the first gate electrode layer, and a second metal via in the second via opening to connect the first source/drain contact;
forming a third insulating layer over the second insulating layer;
etching the third insulating layer to form a first trench opening exposing the first metal via and a second trench opening exposing the second metal via; and
selectively growing a first metal hump from a top surface of the first metal via and a second metal hump from a top surface of the second metal via.

16. The method as claimed in claim 15, further comprising:
forming a first conductive liner in the first trench opening and a second conductive liner in the second trench opening, to cover the first metal hump and the second metal hump, respectively; and forming a first metal line over the first conductive liner and a second metal line over the second conductive liner.

17. The method as claimed in claim 16, further comprising:

forming a second gate electrode layer in the first insulating layer and across the fin structure during the formation of the first gate electrode layer;

forming a second source/drain contact electrically connected to a second source/drain region in the fin structure during the formation of the first source/drain contact;

forming a third via opening and a fourth via opening in the second insulting layer to expose the second gate electrode layer and the second source/drain contact, respectively, during the formation of the first via opening and the second via opening;

forming a third metal via in the third via opening to connect the second gate electrode layer, and a fourth metal via in the fourth via opening to connect the second source/drain contact; and selectively growing a third metal hump from a top surface of the third metal via and a fourth metal hump from a top surface of the fourth metal via during the growth of the first metal hump and the second metal hump.

18. The method as claimed in claim 17, wherein the first conductive liner covers the third metal hump and is formed between the first metal hump and the third metal hump; and wherein the second conductive liner covers the fourth metal hump and is formed between the second metal hump and the fourth metal hump.

19. The method as claimed in claim 17, wherein the first conductive liner covers the third metal hump, and the first metal hump and the third metal hump are laterally merged with each other; and wherein the second conductive liner covers the fourth metal hump, and the second metal hump and the fourth metal hump are laterally merged with each other.

20. The method as claimed in claim 15, further comprising:

forming a second gate electrode layer in the first insulating layer and across the fin structure during the formation of the first gate electrode layer;

forming a second source/drain contact electrically connected to a second source/drain region in the fin structure during the formation of the first source/drain contact;

forming a third via opening and a fourth via opening in the second insulting layer to expose the second gate electrode layer and the second source/drain contact, respectively, during the formation of the first via opening and the second via opening;

forming a third metal via in a third via opening to connect the second gate electrode layer, and a fourth metal via in the fourth via opening and to connect the second source/drain contact; and selectively growing a third metal hump from a top surface of the third metal via and a fourth metal hump from a top surface of the fourth metal via during the growth of the first metal hump and the second metal hump, wherein the first metal hump and the third metal hump are laterally merged with each other and fully fill the first trench opening, and the second metal hump and the fourth metal hump are laterally merged with each other and fully fill the second trench opening.

\* \* \* \* \*